United States Patent
Osanai et al.

(10) Patent No.: US 9,660,512 B2
(45) Date of Patent: May 23, 2017

(54) ELECTRONIC DEVICE FOR ACQUIRING SPECIFIC INFORMATION OF RESPECTIVE SWITCHING ELEMENTS

(71) Applicants: Yosuke Osanai, Toyota (JP); Yukio Onishi, Nagoya (JP)

(72) Inventors: Yosuke Osanai, Toyota (JP); Yukio Onishi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/765,451

(22) PCT Filed: Apr. 12, 2013

(86) PCT No.: PCT/JP2013/061125
§ 371 (c)(1),
(2) Date: Aug. 3, 2015

(87) PCT Pub. No.: WO2014/167734
PCT Pub. Date: Oct. 16, 2014

(65) Prior Publication Data
US 2016/0020688 A1 Jan. 21, 2016

(51) Int. Cl.
H03K 3/00 (2006.01)
H02M 1/088 (2006.01)
H02M 1/092 (2006.01)
H02M 7/5387 (2007.01)
H03K 17/795 (2006.01)
(Continued)

(52) U.S. Cl.
CPC .......... H02M 1/088 (2013.01); H02H 7/1225 (2013.01); H02M 1/092 (2013.01); H02M 7/5387 (2013.01); H03K 17/18 (2013.01); H03K 17/56 (2013.01); H03K 17/795 (2013.01)

(58) Field of Classification Search
CPC .... H02M 1/088; H02M 7/5387; H02M 1/092; H02H 7/1225; H03K 17/18; H03K 17/56
See application file for complete search history.

(56) References Cited

U.S. PATENT DOCUMENTS 5,900,683 A * 5/1999 Rinehart et al. ... H03K 17/0828
307/126
9,030,054 B2 * 5/2015 Jacobson et al. ....... H02M 1/08
307/115
(Continued)

FOREIGN PATENT DOCUMENTS

JP H03-204223 A 9/1991
JP H04-290334 A 10/1992
(Continued)

Primary Examiner — Kenneth B Wells
(74) Attorney, Agent, or Firm — Oliff PLC

(57) ABSTRACT

There is provided an electronic device comprising: a plurality of switching elements connected to a power supply; a plurality of specific information storage units provided for the corresponding switching elements and configured to store specific information of respective corresponding switching elements; a processing unit configured to control the switching elements; and a communication line disposed between the specific information storage units and the processing unit, through which the specific information of the respective switching elements is sent from the specific information storage units to the processing unit.

5 Claims, 21 Drawing Sheets

(51) Int. Cl.
*H03K 17/56* (2006.01)
*H03K 17/18* (2006.01)
*H02H 7/122* (2006.01)

(56) References Cited

U.S. PATENT DOCUMENTS

| | | |
|---|---|---|
| 2011/0221370 A1 | 9/2011 | Fukuta et al. |
| 2014/0092655 A1 | 4/2014 | Igarashi et al. |
| 2014/0197869 A1 | 7/2014 | Watanabe et al. |
| 2014/0285002 A1 | 9/2014 | Onishi |
| 2016/0105112 A1* | 4/2016 | Ukegawa et al. ... H02H 7/1213 323/271 |

FOREIGN PATENT DOCUMENTS

| | | |
|---|---|---|
| JP | H07-95761 A | 4/1995 |
| JP | 2005-033534 A | 2/2005 |
| JP | 2005-261104 A | 9/2005 |
| JP | 2014-136482 A | 7/2014 |
| JP | 2014-187804 A | 10/2014 |
| JP | 2015053813 A | 3/2015 |
| WO | 2012077187 A1 | 6/2012 |

* cited by examiner

ELECTRONIC DEVICE FOR ACQUIRING SPECIFIC INFORMATION OF RESPECTIVE SWITCHING ELEMENTS

TECHNICAL FIELD

The disclosure is related to an electronic device.

BACKGROUND ART

A power conversion apparatus is known, which includes a power converter configured by a plurality of semiconductor elements, a gate logic circuit for generating a gate signal for switching on/off the respective semiconductor elements, a gate drive circuit for driving the semiconductor elements, a first transmitting circuit for transmitting the gate signal to the gate drive circuit and a second transmitting circuit for transmitting a feedback signal indicating on/off of the semiconductor elements from the gate drive circuit wherein two fault detecting circuits detect errors based on a logical sum of the gate signal and the feedback signal (for example, Japanese Laid-open Patent Publication No. H07-095761).

RELATED ART DOCUMENT

Patent Document

[Patent Document 1] Japanese Laid-open Patent Publication No. H07-095761

DISCLOSURE OF THE INVENTION

Problems to be Solved by the Invention

However, according to a configuration disclosed in Patent Document 1, although an error (fault) is detected within the entire semiconductor elements, the specific semiconductor element cannot be identified.

Therefore, an object of the present disclosure is to provide an electronic device capable of acquiring specific information of respective switching elements.

Means for Solving the Problems

According to an embodiment of the present invention, there is provided an electronic device comprising: a plurality of switching elements connected to a power supply; a plurality of specific information storage units provided for the corresponding switching elements and configured to store specific information of respective corresponding switching elements; a processing unit configured to control the switching elements; and a communication line disposed between the specific information storage units and the processing unit, through which the specific information of the respective switching elements is sent from the specific information storage units to the processing unit.

Effects of the Present Invention

According to the disclosed technology, an electronic device capable of acquiring specific information of respective switching elements is provided.

MODE FOR CARRYING OUT THE INVENTION

In the following, embodiments are described in detail with reference to appended drawings.

Figure 1:
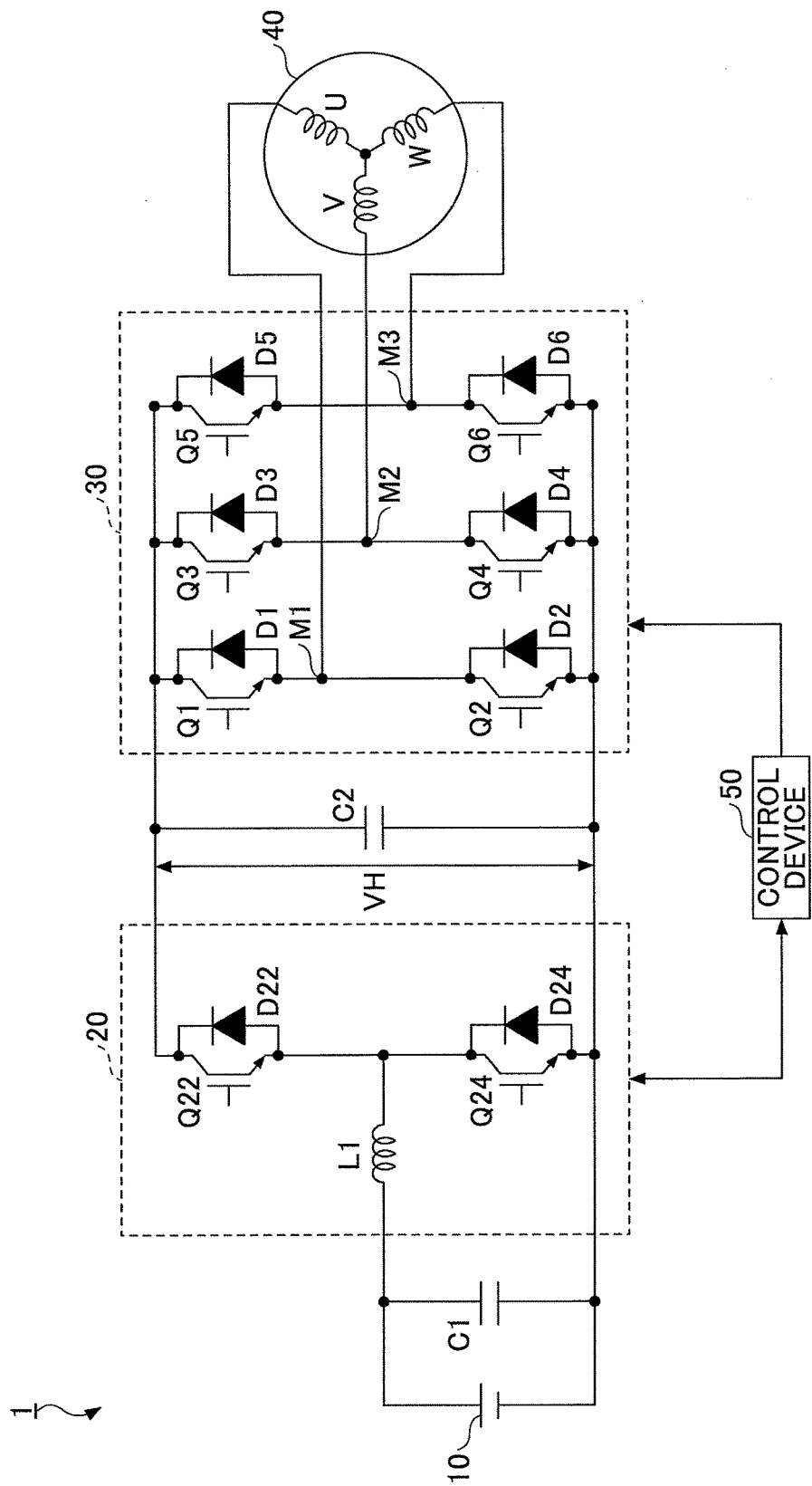
FIG. 1 is a diagram for illustrating an example of an overall configuration of a motor drive system 1 for an electric vehicle.

FIG. 1 is a diagram for illustrating an example of overall configuration of a motor drive system 1 for an electric vehicle. The motor drive system 1 is a system for driving a vehicle by driving a traveling motor 40 using the electric power of a battery 10. Additionally, the details of the driving method or configuration of the electric vehicle are optional as long as it is running by driving the traveling motor 40 using electric power. Generally, the electric vehicle includes hybrid vehicles (HV) which include an engine and the driving motor 40 as a power source and electric vehicles which only include the travelling motor 40 as a power source.

As shown in FIG. 1, the motor drive system 1 includes a battery 10, a DC/DC converter 20, an inverter 30, the traveling motor 40 and a semiconductor element drive device 50.

The battery 10 is an arbitrary storage battery for accumulating electric power for output, and may be configured as a nickel hydrogen battery, a lithium ion battery or a capacitive device such as an electric double-layered capacitor.

The DC/DC converter 20 may be a bidirectional DC/DC converter (a boosting DC/DC converter with reversible chopper). For example, the DC/DC converter 20 may be capable of stepping-up conversion from 200V to 650V and stepping-down conversion from 650V to 200V. A smoothing capacitor C1 may be connected between the input side of a reactor (coil) L1 of the DC/DC converter 20 and a negative electrode line.

In FIG. 1, the DC/DC converter 20 includes two switching elements Q22 and Q24 and the reactor L1. The two switching elements Q22 and Q24 are respectively connected in series between a positive electrode line and a negative electrode line of the inverter 30. The reactor L1 is connected in series with a positive electrode of the battery 10. The output side of the reactor L1 is connected at a connection point between the switching elements Q22 and Q24.

In FIG. 1, the two switching elements Q22 and Q24 of the DC/DC converter 20 are IGBTs (Insulated Gate Bipolar Transistor). Additionally, the switching elements Q22 and Q24 may be average IGBT using diodes (for example, freewheel diodes) D22 and D24 as external elements, or may be RC (Reverse Conducting)-IGBT in which the diodes D22 and D24 are included. In both cases, a collector of the switching element Q22 in an upper arm is connected with the positive electrode line of an inverter 30 while an emitter of the switching element Q22 in the upper arm is connected with a collector of the switching element Q24 in a lower arm. Also, an emitter of the switching element Q24 in the lower arm is connected with a negative electrode line of the inverter 30 and the negative electrode of the battery 10. Additionally, the switching elements Q22 and Q24 may be formed by switching elements other than IGBT such as MOSFET (Metal Oxide Semiconductor Field-Effect Transistor).

The inverter 30 is configured by respective arms of U phase, V phase and W phase which are disposed in parallel between the positive electrode line and the negative electrode line. A U phase arm is configured by switching elements (IGBTs in present embodiment) Q1 and Q2 connected in series, a V phase arm is configured by switching elements (IGBTs in present embodiment) Q3 and Q4 connected in series, a W phase arm is configured by switching elements (IGBTs in present embodiment) Q5 and Q6 connected in series. Also, between collectors and emitters of the respective switching elements Q1-Q6, diodes D1-D6 are disposed so as to flow current from the emitter side to the collector side. Additionally, the switching elements Q1-Q6 may be of switching elements other than IGBT such as MOSFET.

The traveling motor 40 is a three-phase permanent-magnet motor, in which the respective ends of three coils of the U phase, the V phase and the W phase are connected to each other commonly at a central point. The other end of the U phase coil is connected with a central point M1 between the switching elements Q1 and Q2, the other end of the V phase coil is connected with a central point M2 between the switching elements Q3 and Q4 and the other end of the W phase coil is connected with a central point M3 between the switching elements Q5 and Q6. A smoothing capacitor C2 is connected between the collector of the switching element Q1 and the negative electrode line. Additionally, a method of connecting the three coils of the U phase, the V phase and the W phase may be a Δ connection. Also, the traveling motor 40 may be a three-phase hybrid motor combining an electromagnet and a permanent magnet.

Additionally, a second traveling motor or a power generator may be added in addition to the traveling motor 40 in parallel. In this case, a corresponding inverter may also be added.

The semiconductor element drive device 50 controls the DC/DC converter 20 and the inverter 30. The semiconductor element drive device 50 may be achieved by an ECU (electronic control unit) including a microcomputer. Additionally, functions (including functions described below) of the semiconductor element drive device 50 may be achieved by arbitrary hardware, software, firmware or a combination thereof. For example, the functions of the semiconductor element drive device 50 may be achieved by ASIC (application-specific integrated circuit) or FPGA (Field Programmable Gate Array) for a specific use. Also, the functions of the semiconductor element drive device 50 may be achieved by a cooperation between a plurality of the ECUs.

A schema of the control method of the DC/DC converter 20 may be arbitrary. Typically, the semiconductor element drive device 50 controls the DC/DC converter 20 according to the operation (power running operation or regenerative operation) of the inverter 30. For example, when performing a power running operation, the semiconductor element drive device 50 only switches on/off the switching element Q24 in the lower arm of the DC/DC converter 20 (one side arm driven by the lower arm) thereby stepping-up the voltage of the battery 10 to be output to the inverter 30 side. At this time, the switching element Q24 in the lower arm may be PWM (Pulse Width Modulation)-controlled. Also, when performing a regenerative operation, the semiconductor element drive device 50 only switches on/off the switching element Q22 in the upper arm of the DC/DC converter (one side arm driven by the upper arm) thereby stepping-down the voltage at the inverter 30 side to be output to the battery 10 side. At this time, the switching element Q22 in the upper arm may be PWM-controlled. Further, when the current flowing in the reactor L1 crosses "0" (zero cross timing), the semiconductor element drive device 50 may switch on/off (drive) the two switching elements Q22 and Q24 in the reverse phase (both side arms driven).

A schema of the control method of the inverter 30 may be arbitrary. Typically, the semiconductor element drive device 50 switches on/off the two switching elements Q1 and Q2 of the U phase, the two switching elements Q3 and Q4 of the V phase, and the two switching elements Q5 and Q6 of the W phase so that, for example, phase currents flowing in the coils of the respective phases form sign waves with phase deviations of 120°.

Figure 2:
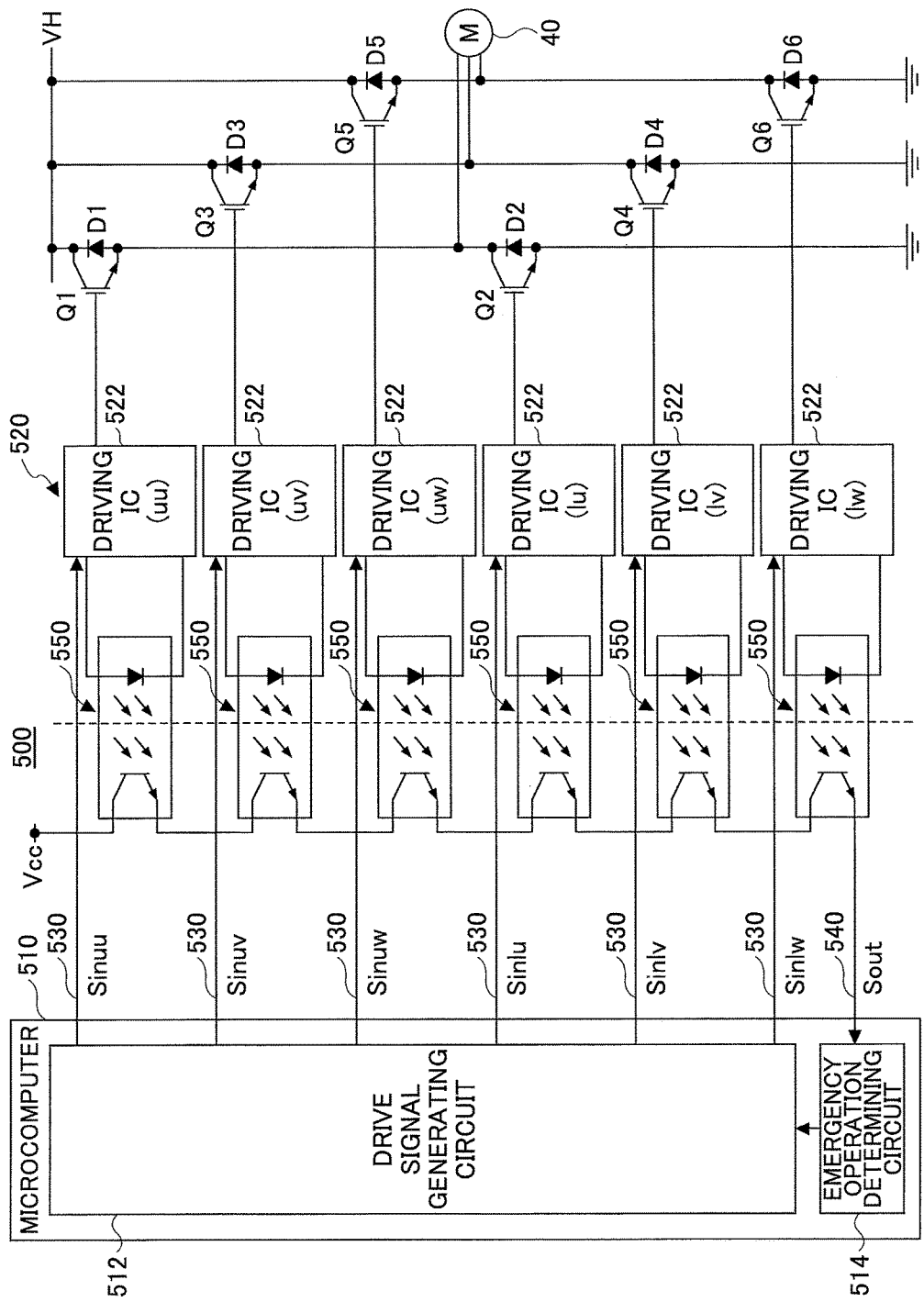
FIG. 2 is a diagram for illustrating an example configuration of a control unit 500 of an inverter 30 included in a semiconductor element drive device 50.

FIG. 2 is a diagram for illustrating an example configuration of a control unit 500 of the inverter 30 included in the semiconductor element drive device 50.

The control unit 500 of the inverter 30 includes a microcomputer 510, and a driving IC (integrated circuit) unit 520. The microcomputer 510 includes a drive signal generating circuit 512 and an emergency operation determining circuit 514. The driving IC unit 520 includes six driving ICs 522 corresponding to the switching elements Q1-Q6. Additionally, in FIG. 2, reference characters "uu" and "uv" described in the six driving ICs 522 indicate corresponding arms. For example, "uu" indicates the driving IC 522 corresponding to the switching element Q1 of the U phase of the upper arm. Additionally, the six driving ICs 522 may be achieved by one or more numbers of driving ICs. For example, the six driving ICs 522 may be achieved by one driving IC. In this case, the one driving IC includes respective circuit parts corresponding to the six driving ICs 522.

A communication line 530 for gate signal and a communication line 540 for feedback signal are disposed between the microcomputer 510 and the driving IC unit 520. Six communication lines 530 for gate signals are disposed corresponding to the switching elements Q1-Q6. That is, the communication lines 530 for gate signal are respectively disposed corresponding to the six driving ICs 522. Meanwhile, as shown in FIG. 2, the communication line 540 for feedback signal is common to the six driving ICs 522. That is, as shown in FIG. 2, only one communication line 540 for feedback signal is disposed. One end of the communication line 540 for feedback signal is connected to a power supply voltage Vcc, while the other end thereof is connected to the microcomputer 510. The communication line 540 for feedback signal includes six photocouplers 550 corresponding to the respective six driving ICs 522. The six photocouplers 550 (output side transistors) may be connected in series between the power supply voltage Vcc and the microcomputer 510. The driving ICs 522 respectively send feedback signals (IC output signal Sout) to the microcomputer 510 by switching on/off the corresponding photocouplers 550 to vary a voltage level of the communication line 540 for feedback signal between "Hi" and "Lo". A detailed description of the feedback signal will be given below.

The drive signal generating circuit 512 generates a gate signal (Sinuu-Sinlw) for switching on/off the switching elements Q1-Q6 of the inverter 30. The gate signal is applied to gates of the switching elements Q1-Q6 through the communication line 530 and the driving IC 522. A generation method of the gate signal may be arbitrary. For example, the drive signal generating circuit 512 may determine a motor torque command value (target drive torque) based on an accelerator's degree of opening and a vehicle speed, thereby calculating a duty for switching on/off the switching elements Q1-Q6 based on the determined motor torque command value and sensor values (for example, detection values of currents of the respective phases by current sensors, or detection values of revolutions of a motor by a resolver). Then, the drive signal generating circuit 512 may generate the gate signal with the calculated duty and carrier signal.

The emergency operation determining circuit 514 determines whether an emergency operation is required based on the output Sout (feedback signal) of the driving IC unit 520. For example, an emergency operation means an operation for temporarily controlling the inverter 30 so that the vehicle can travel and retreat to a safe location even if a failure occurs in the switching elements Q1-Q6, or the like. When determining that the emergency operation is required, the drive signal generating circuit 512 controls the inverter 30 by a certain (predetermined) method for enabling it to perform the emergency operation.

Figure 3:
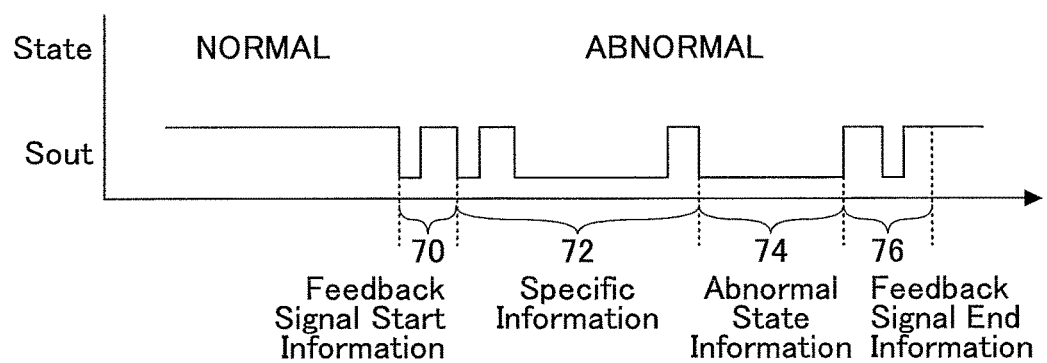
FIG. 3 is a diagram for showing an example of a feedback signal (IC output signal Sout)

FIG. 3 is a diagram for showing an example of the feedback signal (IC output signal Sout). For example, as shown in FIG. 3, the IC output signal Sout remains at a "Hi" level when a state of the switching elements Q1-Q6 is normal. That is, the six photocouplers 550 are switched on when the state of the switching elements Q1-Q6 is normal. The feedback signal is generated when the state of the switching elements Q1-Q6 is abnormal.

As shown in FIG. 3, the feedback signal includes a feedback signal start information 70, a specific information 72, an abnormal state information 74 and a feedback signal end information 76. The feedback signal sent to the microcomputer 510 may be generated only once, or may be generated repeatedly during continuation of the abnormal state.

The feedback signal start information 70 indicates the start of the feedback signal. The specific information 72 indicates information unique to the respective switching elements Q1-Q6, that is, ID information. The abnormal state information 74 indicates the details of the abnormality. There may be a plurality of details, corresponding to detectable (determinable) abnormalities. For example, the details may include information indicating a protective operation of a protection function when the protection function of the driving IC 522 is served. The protection function may include short-circuiting protection, overcurrent protection, overheating protection, abnormal voltage protection, defective substrate part detection, and the like. The feedback signal end information 76 indicates the end of the feedback signal.

The respective driving ICs 522 of the driving IC unit 520 generate the feedback signal and send it to the microcomputer 510 when detecting the abnormality (when performing a protective operation). At this time, the respective driving ICs 522 send the feedback signal to the microcomputer 510, which includes the specific information 72 of corresponding switching element among the switching elements Q1-Q6 and the abnormal state information 74 corresponding to the detected abnormality. Additionally, for this purpose, the respective driving ICs 522 include storage units (not shown) for storing the specific information 72 of corresponding switching elements. The storage unit may be an EEPROM (Electrically Erasable Programmable ROM) or the like. Additionally, the microcomputer 510, upon receiving the feedback signal, determines which switching element of the switching elements Q1-Q6 has an abnormality and what type based on the specific information 72 and the abnormal state information 74, thereby performing a process (for example, the emergency operation) according to the determination result.

As described above, according to the example shown in FIG. 2 and FIG. 3, the feedback signal of the switching elements Q1-Q6 can be sent from the driving IC unit 520 to the microcomputer 510 through the communication line 540 for feedback signal. Thus, the microcomputer 510 can determine respective states of the switching elements Q1-Q6, such as which switching element among the switching elements Q1-Q6 is in an abnormal state. Also, since the common single communication line 540 for feedback signal is used by the six driving ICs 522, a simple configuration can be adopted in comparison to a case where similar communication lines for feedback signals are respectively disposed corresponding to the six driving ICs.

Further, according to the example shown in FIG. 2 and FIG. 3, since the feedback signal includes the specific information 72 in addition to the abnormal state information 74, the microcomputer 510 can recognize the details corresponding to the abnormality (abnormal state) of the switching elements Q1-Q6. Thus, the appropriate emergency operation can be performed by the microcomputer 510 according to the details corresponding to the abnormality.

Additionally, in the example shown in FIG. 3, although the feedback signal includes the feedback signal start information 70, the specific information 72, the abnormal state information 74 and the feedback signal end information 76, all the information is optional except the specific information 72. For example, the feedback signal may include information for indicating various states of the switching elements Q1-Q6 instead of or in addition to the abnormal state information 74. The information for indicating the various states of the switching elements Q1-Q6 may include sensor information from temperature sensors or current sensors (sense emitter (see FIG. 15)) where the sensors may be disposed in the respective switching elements Q1-Q6. Or the feedback signal may include only specific information 72. In this case, when detecting an abnormality, the respective driving ICs 522 generate feedback signals including only the specific information 72 (feedback signals without the abnormal state information 74) and send them to the microcomputer 510. The microcomputer 510 in this case can also identify an abnormal switching element (or abnormal switching elements) among the switching elements Q1-Q6 based on the specific information 72 included in the feedback signal.

Further, according to the example shown in FIG. 3, the respective information in the feedback signal is expressed by a certain pattern of Hi level and a Lo level, whereas the pattern of a Hi level or a Lo level is optional. Also, the feedback signal may be a digital signal or an analog signal.

Figure 4:
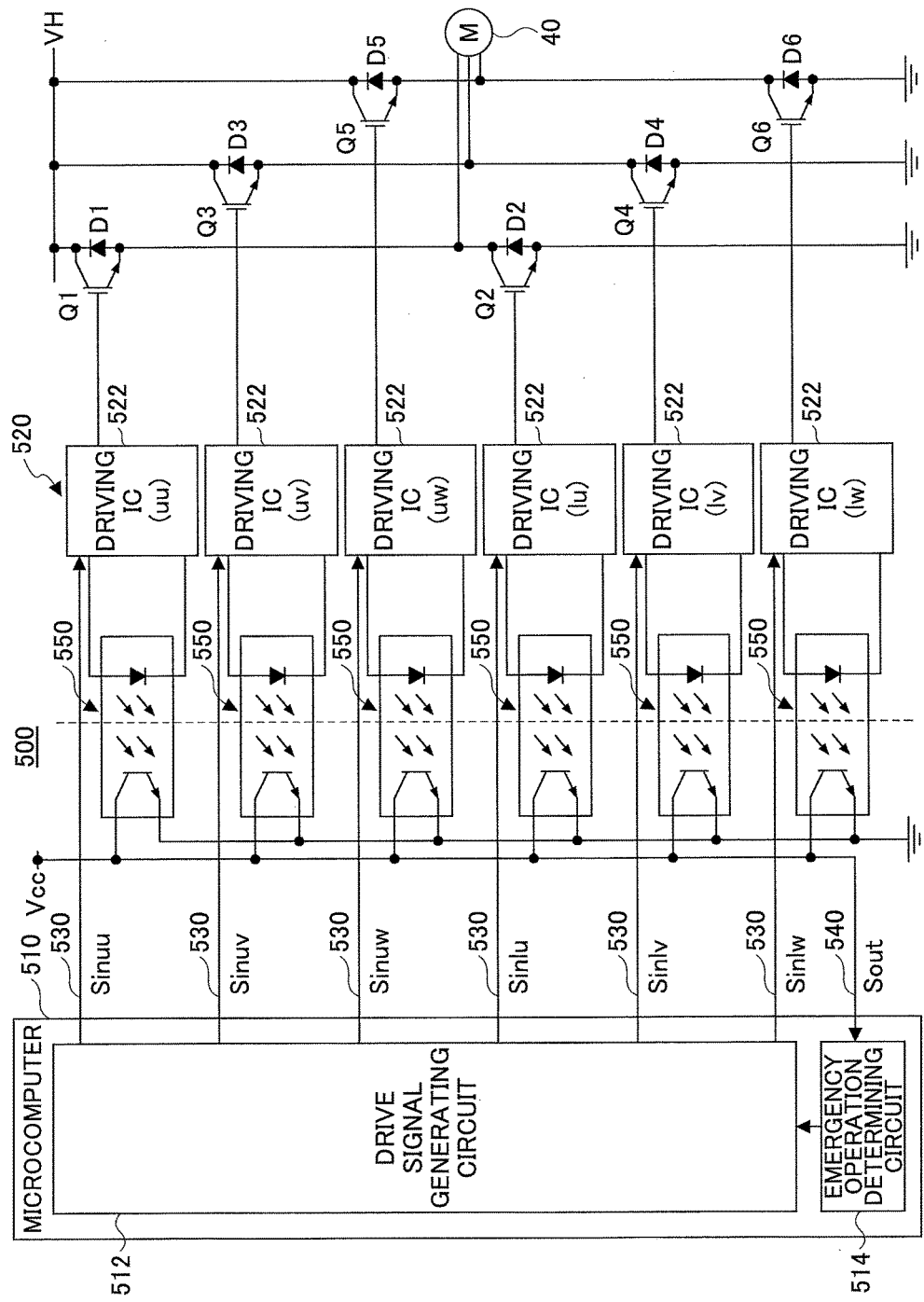
FIG. 4 is a diagram for illustrating another example of a control unit 500 of the inverter 30 included in the semiconductor element drive device 50.

FIG. 4 is a diagram for illustrating another example of the control unit 500 of the inverter 30 included in the semiconductor element drive device 50.

In the example shown in FIG. 4, the six photocouplers 550 (output side transistors) are connected in parallel with the communication line 540 for feedback signal, which is different from the example shown in FIG. 2. That is, in the example shown in FIG. 2, the six photocouplers 550 are connected in series with the communication line 540 for the feedback signal, while in the example shown in FIG. 4, the six photocouplers 550 (output side transistors) are connected in parallel with the communication line 540 for feedback signal. In this case, a feedback signal similar to the example shown in FIG. 3 can also be sent. However, in the example shown in FIG. 4, the six photocouplers 550 are always switched off during a normal state of the switching elements Q1-Q6.

According to the example shown in FIG. 4, similarly to the example shown in FIG. 2, the feedback signal of the switching elements Q1-Q6 can be sent from the driving IC unit 520 to the microcomputer 510 through the communication line 540 for feedback signal. Also, since the common single communication line 540 for feedback signal is used by the six driving ICs 522, a simple configuration can be adopted in comparison to a case where similar communication lines for feedback signal are respectively disposed corresponding to the six driving ICs 522.

In the following, a concrete process of the emergency will be described with reference to FIG. 5 and FIG. 6. Additionally, in the following, although the description of the process is given in a case where a short-circuiting abnormality is detected and an overheating abnormality is detected, as representative examples, the process may be similar in a case where another abnormality is detected.

Figure 5:
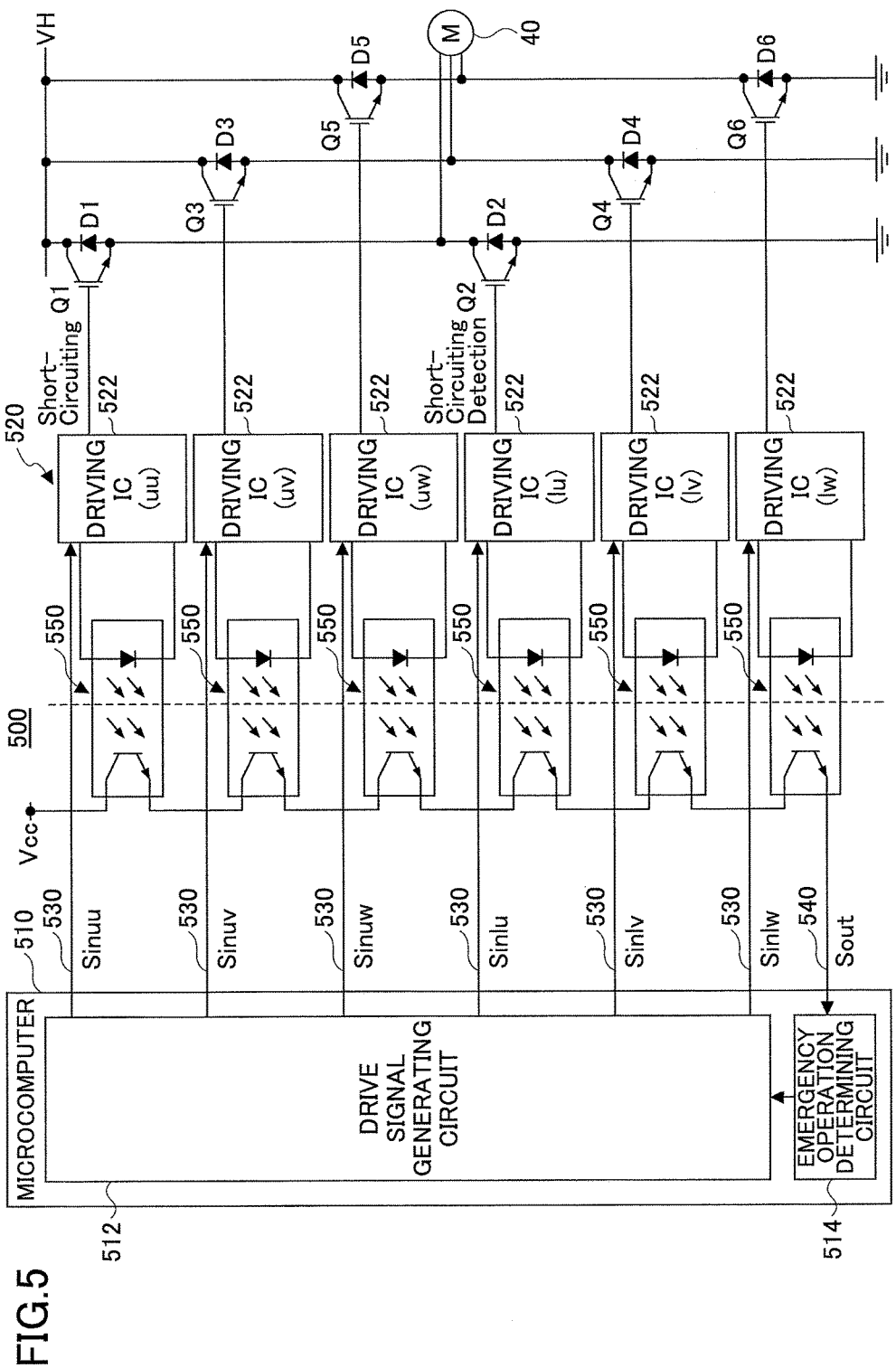
FIG. 5 is an illustration diagram of short-circuiting detection.

FIG. 5 is an illustration diagram of short-circuiting detection. As shown in FIG. 5, the switching element Q1 of the U phase in an upper arm (uu) is assumed to be short-circuited. In this case, the driving IC 522 of the U phase in the lower arm (lu) detects the abnormality. For example, the driving IC 522 of the U phase in the lower arm (lu) may detect the short-circuiting failure (short-circuiting abnormality) of the switching element Q1 based on an abnormal current value. In this case, the driving IC 522 of the U phase in the lower arm (lu) sends the feedback signal to the microcomputer 510 through the aforementioned communication line 540 for the feedback signal as well as protecting the switching elements Q1-Q6 by a protective operation. At this time, the driving IC 522 of the U phase in the lower arm (lu) sends the feedback signal including the specific information 72 of the corresponding switching element Q2 and the abnormal state information 74 corresponding to the detected short-circuiting abnormality to the microcomputer 510. The microcomputer 510 determines that the switching element Q1 of the U phase in the upper arm (uu) which is opposed to the switching element Q2 of the U phase in the lower arm (lu) has a short-circuiting abnormality based on the received specific information 72 and the abnormal state information 74, thereby performing the emergency operation. Specifically, the switching element Q1 in the upper arm is switched on and the switching element Q2 in the lower arm is switched off while the other switching elements Q3-Q6 are switched on/off to perform the emergency operation, thereby enabling retreating.

Figure 6:
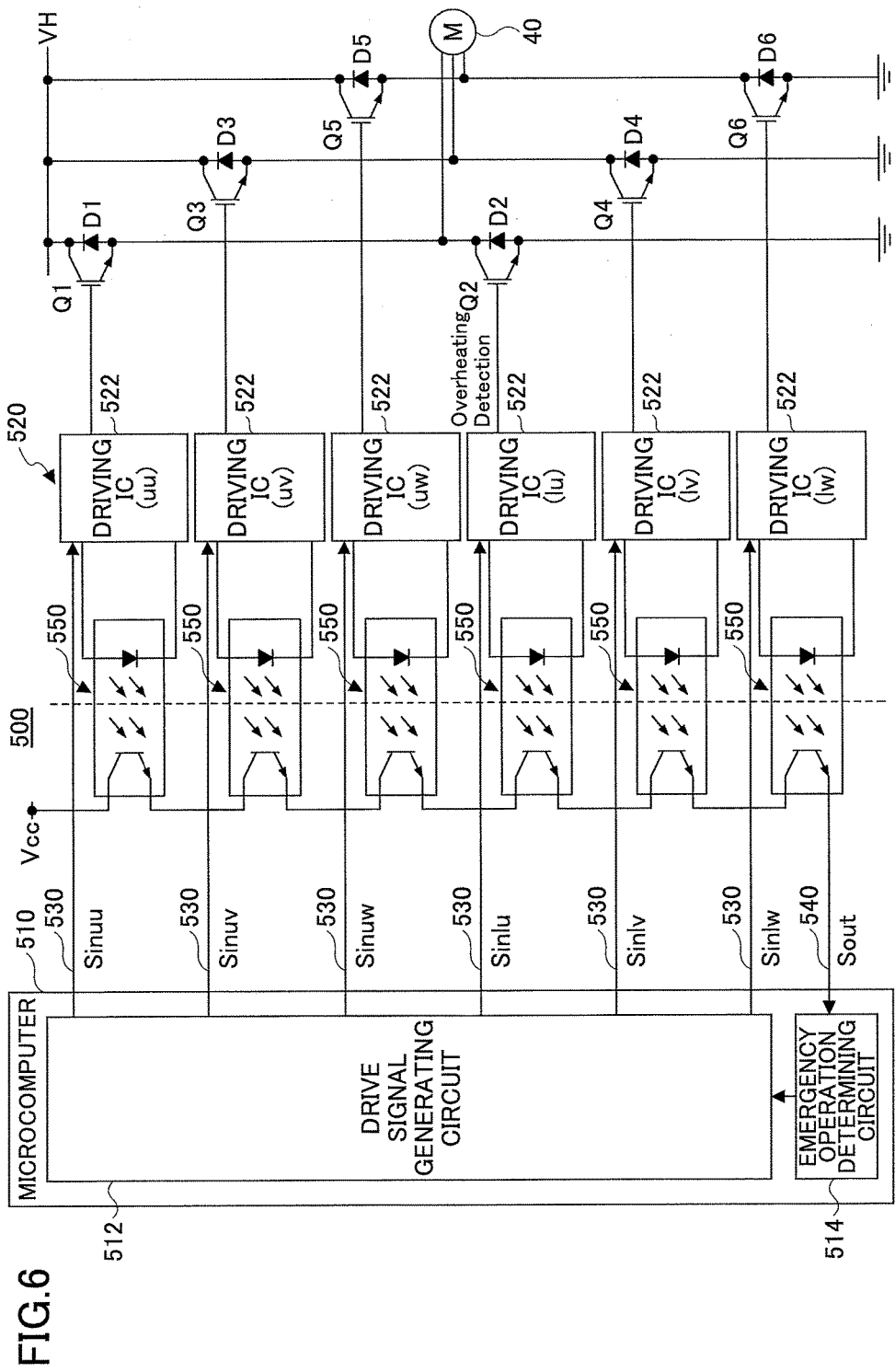
FIG. 6 is an illustration diagram of the abnormal overheating detection.

FIG. 6 is an illustration diagram of abnormal overheating detection. As shown in FIG. 6, the driving IC 522 corresponding to the switching element Q2 is assumed to detect the abnormal overheating. In this case, the driving IC 522 of the U phase of the lower arm (lu) sends an aforementioned feedback signal to the microcomputer 510 through the aforementioned communication line 540 for feedback signal as well as protecting the switching element Q2 by a protective operation (switching off the switching element Q2). At this time, the driving IC 522 of the U phase in the lower arm (lu) sends the feedback signal including the specific information 72 of the corresponding switching element Q2 and the abnormal state information 74 corresponding to the detected abnormal overheating to the microcomputer 510. The microcomputer 510 determines that the switching element Q2 of the U phase in the lower arm (lu) has the abnormal overheating based on the received specific information 72 and the abnormal state information 74, thereby performing the emergency operation. Specifically, the switching element Q2 in the lower arm is switched off while the other switching elements Q1, and Q3-Q6 are switched on/off to perform the emergency operation, thereby enabling retreating. Or the switching elements Q1 and Q2 of the U phase may be switched off while the other switching elements Q3-Q6 are switched on/off to perform the emergency operation.

In the following, a configuration for communicating the specific information of the respective switching elements Q1-Q6 from the microcomputer 510 to the respective driving ICs 522 will be described. That is, the specific information of the respective switching elements Q1-Q6 may be stored in the storage units of respective driving ICs 522 in advance, or, as the configuration described below, communicated from the microcomputer 510 to the respective driving ICs 522.

Figure 7:
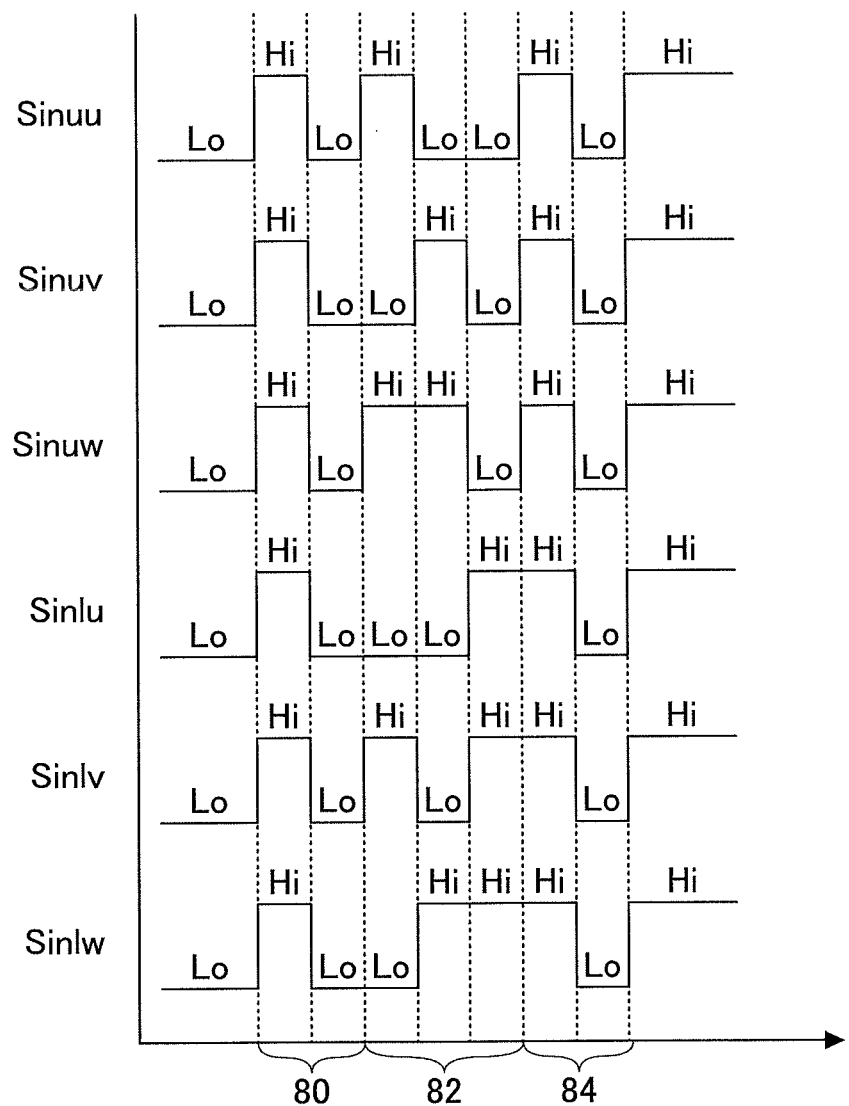
FIG. 7 is a diagram for showing an example of the gate signal on which the specific information is superimposed.

FIG. 7 is a diagram for showing an example of the gate signal on which the specific information is superimposed.

The specific information may be superimposed on the gate signal by using one on-pulse (from the rising edge to the falling edge) among on/off-pulses of the gate signal. In the following, a part of the gate signal on which the specific information is superimposed is referred to as "specific information superimposed gate signal" for convenience of explanation. In the example, shown in FIG. 7, specific information superimposed gate signal includes information 80 for indicating a start of the specific information superimposed gate signal, specific information 82, and information 84 for indicating the end of specific information superimposed gate signal. Additionally, the specific information 82 sent from the respective driving ICs 522 may correspond to the specific information 72 included in the feedback signal output from the corresponding driving IC 522 on a one-to-one basis.

The driving ICs 522, receiving the specific information superimposed gate signal, may store the specific information 82 of the specific information superimposed gate signal in the respective storage units (not shown). The storage unit may be an EEPROM such as a flash memory. The driving ICs 522 generates the specific information 72 based on the specific information 82 stored in the storage unit when generating the aforementioned feedback signal.

Additionally, the pattern of the Hi level and the Lo level in the specific information superimposed gate signal shown in FIG. 7 is not a limiting example, the pattern may be varied. Also, the specific information superimposed gate signal may be a digital signal or an analog signal. Further, the information 84 for indicating the end of the specific information superimposed gate signal may be omitted. In this case, the specific information 82 may be extracted based on the signal (information) received within a certain period from receiving the information 80 for indicating the start of the specific information superimposed gate signal.

Figure 8:
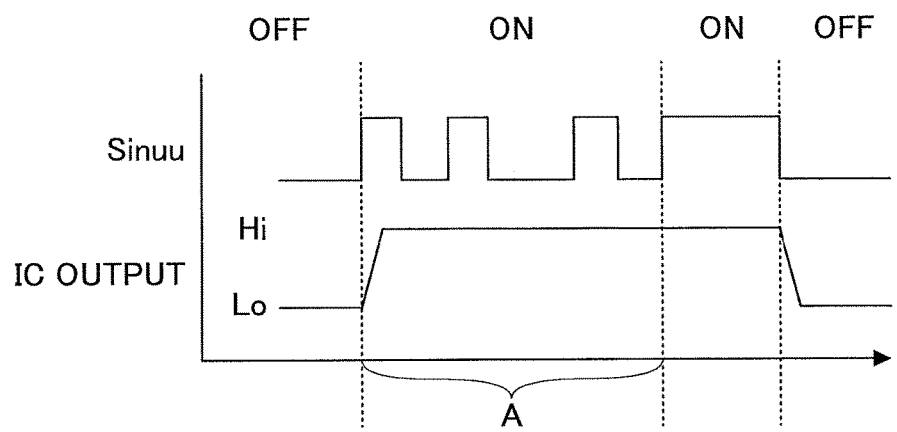
FIG. 8 is a diagram for illustrating an example relationship between the specific information superimposed gate signal and the output of the driving IC 522 (gate input of the switching element)

FIG. 8 is a diagram for illustrating an example relationship between the specific information superimposed gate signal and the output of the driving IC 522 (gate input of the switching element). Here, although the switching element Q1 is described as the representing example, the other switching elements Q2-Q6 may be described similarly.

In FIG. 8, the waveform of Sinuu indicates a waveform of the specific information superimposed gate signal, and the information 80, the specific information 82 and the information 84 are superimposed in a section A thereof. In this case, as shown in FIG. 7, the driving IC 522 of the switching element Q1 switches on (Hi output) the switching element Q1 while receiving the specific information superimposed gate signal, regardless of the state of Hi/Lo in the specific information superimposed gate signal. However, even in receiving the specific information superimposed gate signal, the driving IC 522 of the switching element Q1 performs a protective operation when an abnormality is detected. After receiving the specific information superimposed gate signal (after receiving the information 84), the driving IC 522 of the switching element Q1 normally switches on/off the switching element Q1 according to the state of Hi/Lo of the gate signal.

Additionally, a timing at which the specific information superimposed gate signal is sent from the microcomputer 510 to the respective driving ICs 522 is optional. For example, the timing at which the specific information superimposed gate signal is sent from the microcomputer 510 to the respective driving ICs 522 may be only at an initial operational timing (for example, at initial on-pulse of the gate signal after turning on an ignition switch; that is, the specific information 82 does not always need to be superimposed on the gate signal).

Figure 9:
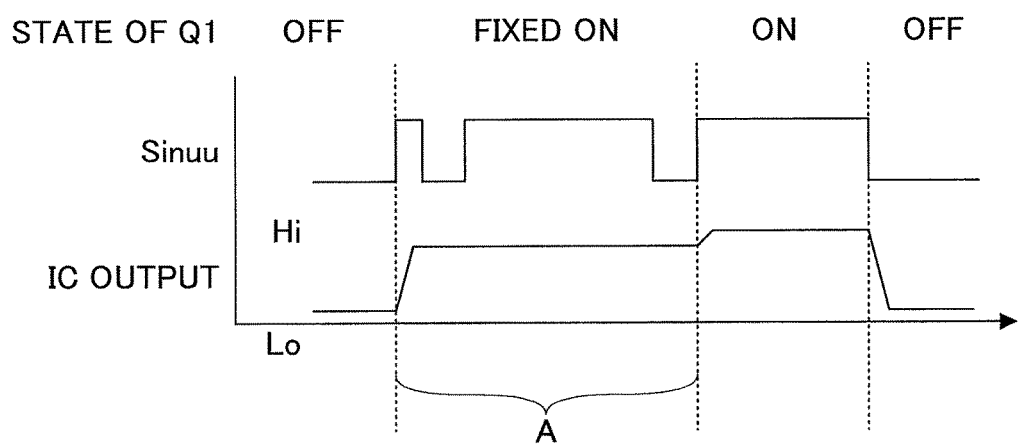
FIG. 9 is a diagram for illustrating another example relationship between the specific information superimposed gate signal and the output of a driving IC 522 (gate input of the switching element)

FIG. 9 is a diagram for illustrating another example relationship between the specific information superimposed gate signal and the output of the driving IC 522 (gate input of the switching element). In FIG. 9, state (on/off) of the switching element Q1 is also shown. Here, although the switching element Q1 is described as the representative example, the other switching elements Q2-Q6 may be described similarly.

In FIG. 9, the waveform of Sinuu indicates a waveform of the specific information superimposed gate signal, where the information 80, the specific information 82 and the information 84 are superimposed in a section A thereof. Similar to the example shown in FIG. 8, as shown in FIG. 7, the driving IC 522 of the switching element Q1 switches on (Hi output) the switching element Q1 during the reception of the specific information superimposed gate signal, regardless of the state of Hi/Lo in the specific information superimposed gate signal. In the example shown in FIG. 9, the driving IC 522 of the switching element Q1 switches on (fixed on) the switching element Q1 during the reception of the specific information superimposed gate signal, even if an abnormality is detected. However, as shown in FIG. 7, the driving IC 522 of the switching element Q1 reduces the gate voltage (while keeping it greater than or equal to a threshold) during reception of a normal gate signal (section of the signal other than section A). After receiving the specific information superimposed gate signal (after receiving the information 84), the driving IC 522 of the switching element Q1 normally switches on/off the switching element Q1 according to the state of Hi/Lo of the gate signal. Therefore, the driving IC 522 of the switching element Q1 immediately performs a protective operation after receiving the specific information superimposed gate signal in a case where an abnormality is detected during the reception of the specific information superimposed gate signal.

In the example shown in FIG. 9, since the switching element Q1 is fixed "on" while receiving the specific information superimposed gate signal even if an abnormality is detected, the period of short-circuiting becomes long which may cause an increase in the short-circuiting energy of the switching element Q1 in a case where the short-circuiting abnormality occurs during reception of the specific information superimposed gate signal. However, according to the example shown in FIG. 9, as described above, since the gate voltage is reduced during reception of the specific information superimposed gate signal, a saturation current of the switching element Q1 is reduced, thereby suppressing an increase of the short-circuiting energy.

In the following, a trigger for sending the feedback signal from the driving ICs 522 of the driving IC unit 520 to the microcomputer 510 through the communication line 540 for feedback signal will be described.

Figure 10:
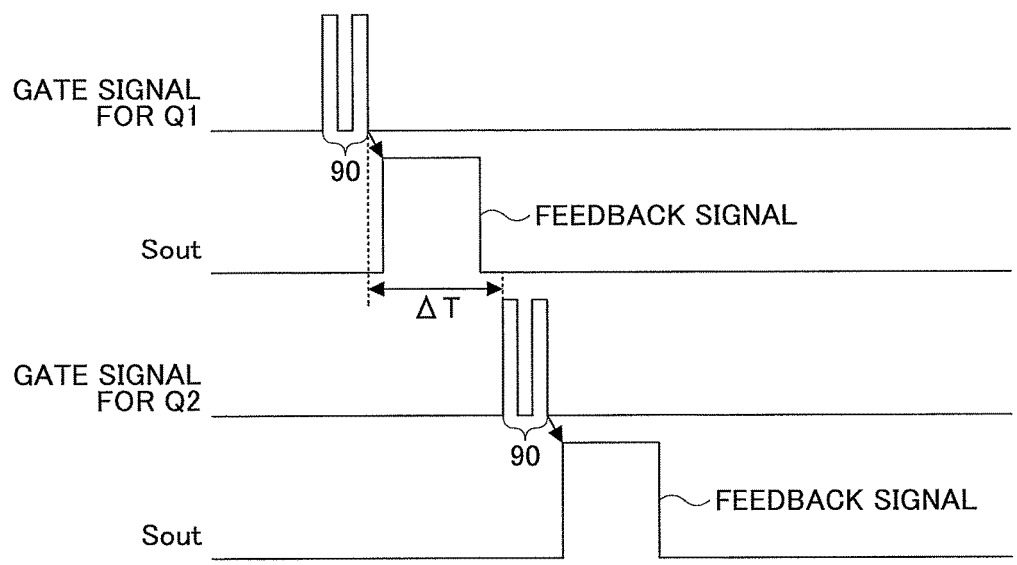
FIG. 10 is a diagram for illustrating an example relationship between a trigger signal from the microcomputer 510 and a timing at which the feedback signal is sent.

FIG. 10 is a diagram for illustrating an example relationship between a trigger signal from the microcomputer 510 and a timing at which the feedback signal is sent. In FIG. 10, although the feedback signal is shown as just one pulse for convenience of explanation, patterns of pulses shown in FIG. 3 and the like may be adopted. Here, in FIG. 10, although the switching elements Q1 and Q2 are described as the representative examples, the other switching elements Q3-Q6 may be described similarly.

The microcomputer 510 sends the trigger signal to the respective driving ICs 522, for requesting the driving ICs 522 to send the feedback signals to the microcomputer 510. The trigger signal may be sent through a communication line other than the communication line 530 for gate signal, however, it is preferably to be sent through the communication line 530 for gate signal. In this case, the trigger signal can be sent to the driving ICs 522 with a simple configuration in which the number of communication lines are reduced (the area of substrate is reduced as well). In the following, a description is given in a case where the trigger signal is sent through the communication line 530 for gate signal.

Although, an arbitrary trigger signal may be adopted, the trigger signal has to be in a form which can be distinguished from a normal gate signal since the respective driving ICs 522 needs to distinguish it from the normal gate signal. A preferable trigger signal will be described below.

The microcomputer 510 sends the trigger signals to the respective driving ICs 522 with intervals greater than or equal to ΔT. As shown in FIG. 10, the interval time ΔT may be a maximum time it takes for the driving IC 522 to send the feedback signal upon receiving the trigger signal or adding a margin thereto.

As shown in FIG. 10, the respective driving ICs 522, receiving the trigger signal, sends the feedback signals to the microcomputer 510. Here, the feedback signal may include information (sensor values of temperature sensors or current sensors) for indicating various states of the switching elements Q1-Q6 instead of the abnormal state information 74. The driving ICs 522 may drive the corresponding switching elements when receiving the trigger signals. Or, the driving ICs 522 may stop driving the corresponding switching elements when recognizing the trigger signal. For example, the corresponding switching element is switched on at a rising edge of the pulse since the trigger signal cannot be distinguished from the gate signal at the rising edge, then, the corresponding switching element may be switched off when the trigger signal is recognized by detecting a pulse-width or the like.

As described above, according to the example shown in FIG. 10, the driving ICs 522 respectively send feedback signals in response to the trigger signals sent from the microcomputer 510. Therefore, mixed feedback signals transmitted to the microcomputer 510 can be prevented in comparison with a configuration where feedback signals are randomly sent from the driving ICs 522 to the microcomputer 510. Specifically, in a configuration where feedback signals are sent using the common communication line 540, the feedback signals sent from the respective driving ICs 522 may be output on the communication line 540 almost simultaneously (that is, interference may be caused). Meanwhile, according to the example shown in FIG. 10, since the timing at which the feedback signal is sent from the driving ICs 522 can be controlled according to the timing at which the trigger signal is sent from the microcomputer, interference can be effectively prevented. That is, the interference can be effectively prevented since timing at which the feedback signal is sent from the driving IC 522 can be determined by the microcomputer 510.

Additionally, since the trigger signal is sent through the communication line 530 for gate signal, preferably, the trigger signal is sent during a period where the level of the gate signal remains Lo (for example, a period when a vehicle speed is "0" or a traveling motor 40 is stopped). For example, the microcomputer 510 may send the trigger signal when the vehicle speed is "0" and a shift range is set in a P-range (set to "park") directly after turning on the ignition switch or the like.

Also, the trigger signal may include information other than information for requesting the feedback information. For example, the trigger information may include information for indicating the types of information to be included in the feedback signal. For example, when the feedback information includes variable information (for example, designated abnormal state information and information for indicating various states of the switching elements Q1-Q6) as well as the specific information, in this case such a configuration is preferred.

Figure 11:
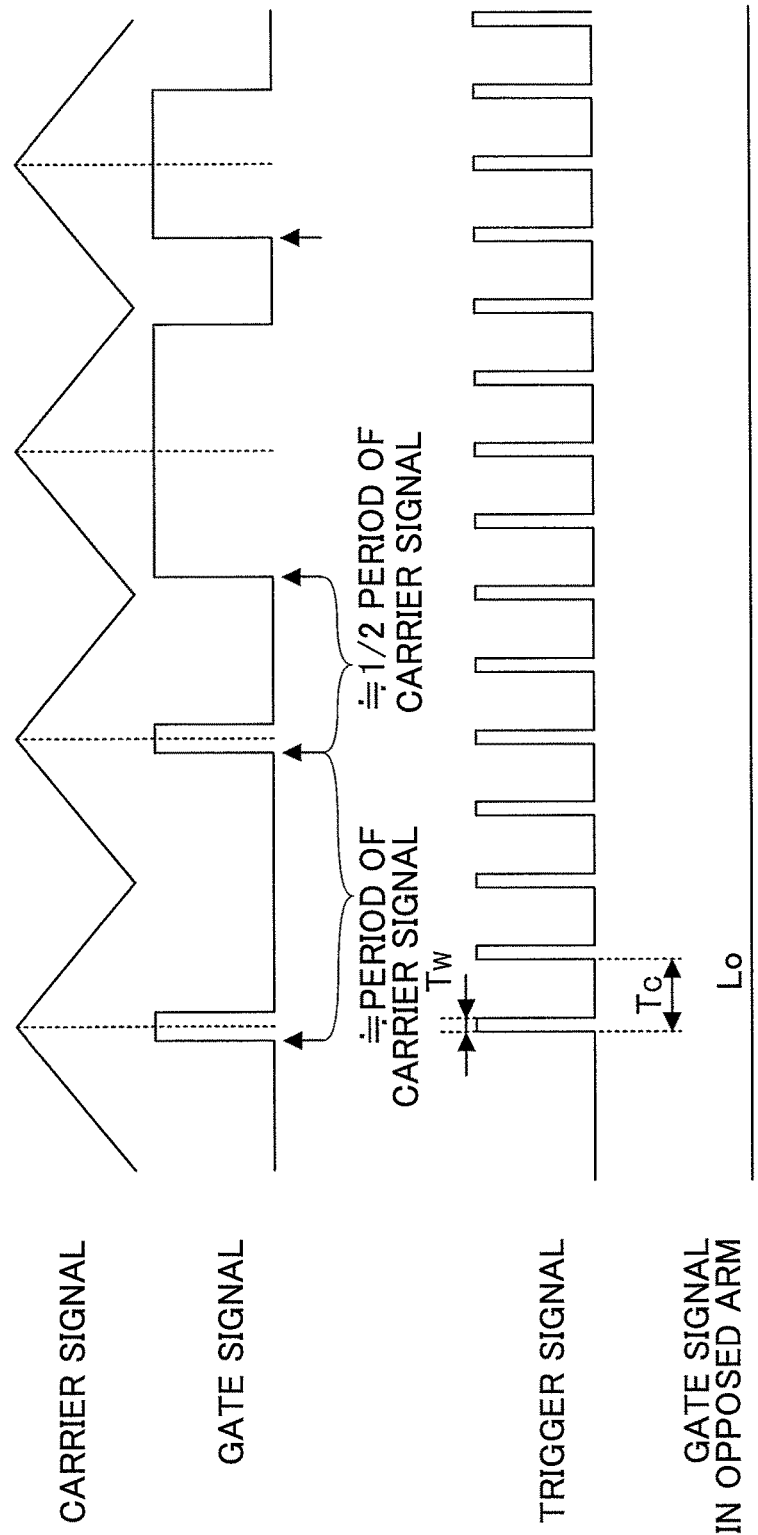
FIG. 11 is a diagram for illustrating an example relationship between a carrier signal and a trigger signal.

FIG. 11 is a diagram for illustrating an example relationship between a carrier signal and the trigger signal.

In the example shown in FIG. 11, the carrier signal is in a form of a triangular wave, and the gate signal is switched between Hi and Lo according to a relationship between the carrier signal and the duty (not shown). In this case, the minimum interval of the rising edges of the gate signal is around a half period of the carrier frequency. Therefore, as shown in FIG. 11, the trigger signal may have a waveform of continuous pulses having rising edges thereof with a frequency shorter than a half of the carrier frequency so that the trigger signal can be distinguished from the gate signal. For example, a period Tc between the edges of the trigger signal may correspond to a time calculated by subtracting a certain margin from a half of the period of the carrier frequency. Also, the pulse width Tw of the trigger signal may correspond to a minimum pulse width recognizable by the driving IC 522. For example, the pulse width Tw of the trigger signal may correspond to the minimum transmission pulse (the time calculated by subtracting a minimum delay of being switched-off from the maximum delay of being switched-on) of the driving IC 522.

In a case where the trigger signal shown in FIG. 11 is used, the driving ICs 522 may recognize the trigger signal when receiving a certain number of rising edges with a frequency corresponding to a period shorter than half of the period of the carrier frequency, and may send the feedback signal to the microcomputer 510. A certain number of rising edges may correspond to a number of pulses in the trigger signal, which may be greater than or equal to two.

Additionally, in the example shown in FIG. 11, the gate signal kept at Lo level is provided to the driving IC 522 in the upper arm or the lower arm in opposition to the driving IC 522 to which the trigger signal is sent. That is, the switching element of the in-phase opposed arm is switched off during transmission of the trigger signal in order to prevent short-circuiting.

Figure 12:
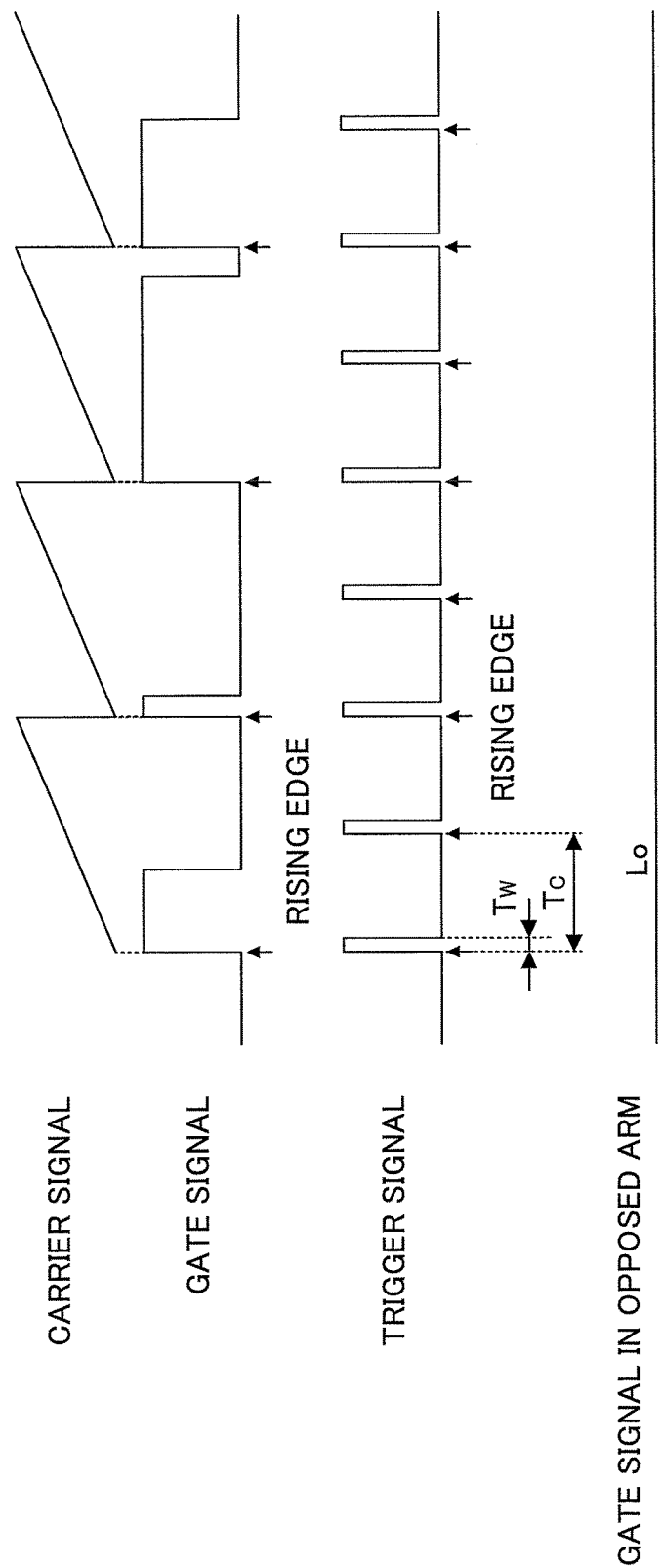
FIG. 12 is a diagram for illustrating another example relationship between the carrier signal and the trigger signal.

FIG. 12 is a diagram for illustrating an example relationship between the carrier signal and the trigger signal.

In the example shown in FIG. 12, the carrier signal is in the form of a saw tooth wave, rising edges of the gate signal appear with the carrier frequency. In this case, the periods between the rising edges of the gate signal define the carrier frequency. Therefore, as shown in FIG. 12, the trigger signal may have a waveform of continuous pulses having rising edges thereof with a frequency higher than the carrier frequency so that the trigger signal can be distinguished from the gate signal. For example, the period Tc between the edges of the trigger signal may correspond to a time calculated by subtracting a certain margin from a period of the carrier frequency. In the example shown in FIG. 12, the period Tc between the edges of the trigger signal is a half period of the carrier frequency. Also, the pulse width Tw of the trigger signal may correspond to a minimum pulse width recognizable by the driving IC 522. For example, the pulse width Tw of the trigger signal may correspond to the minimum transmission pulse (the time calculated by subtracting a minimum delay of being switched-off from a maximum delay of being switched-on) of the driving IC 522.

In a case where the trigger signal shown in FIG. 12 is used, the driving ICs 522 may recognize the trigger signal when receiving a certain number of rising edges with a frequency higher than the carrier frequency, and may send the feedback signal to the microcomputer 510. The number of rising edges may correspond to a number of pulses in the trigger signal, which may be greater than or equal to two.

Additionally, in the example shown in FIG. 12, the gate signal kept at Lo level is provided to the driving IC 522 in the upper arm or the lower arm in opposition to the driving IC 522 to which the trigger signal is sent. That is, the switching element of the in-phase opposed arm is switched off during transmission of the trigger signal in order to prevent short-circuiting.

Figure 13:
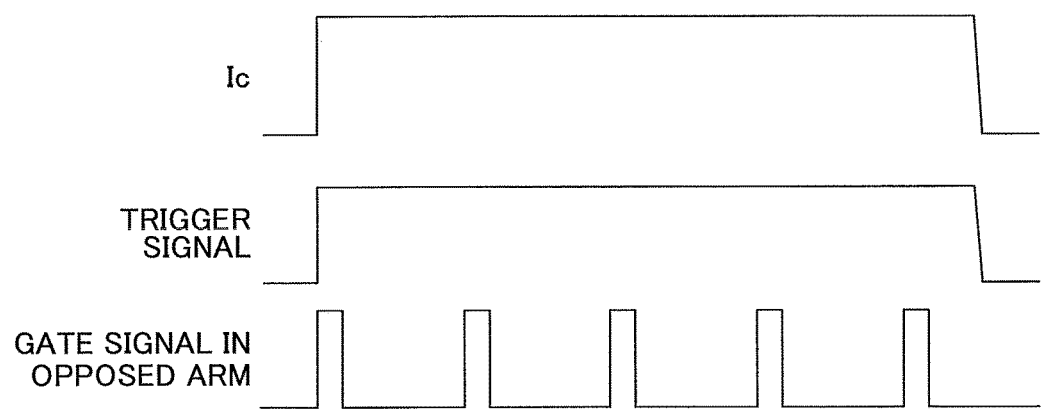
FIG. 13 is a diagram for showing another example of the trigger signal.
Figure 14:
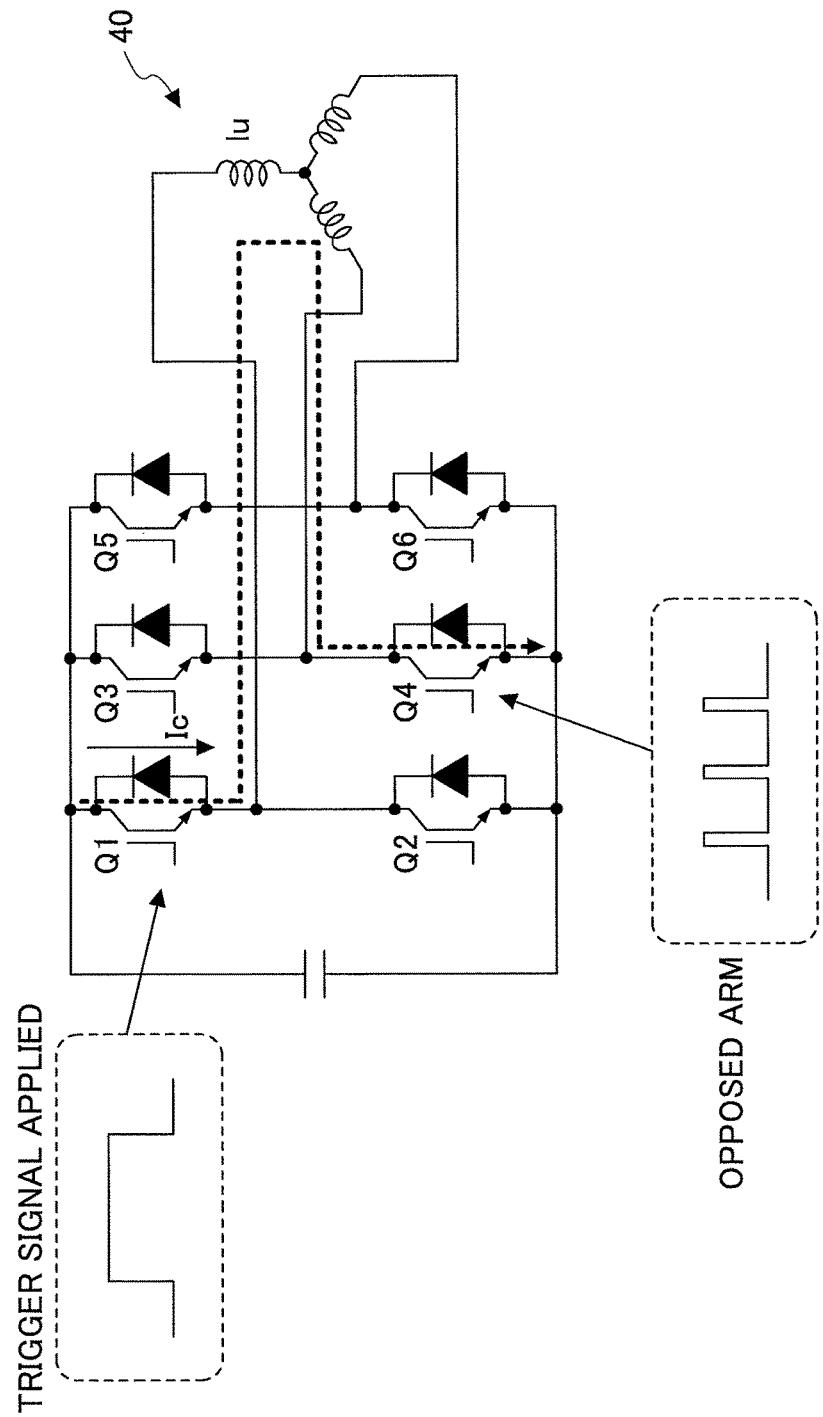
FIG. 14 is a diagram for illustrating an example of a current flow when applying the trigger signal to the driving IC 522 of the switching element Q1.

FIG. 13 is a diagram for showing another example of the trigger signal. In FIG. 13, a waveform of a collector current Ic of the switching element Q1 and a waveform of the gate signal in the opposed arm. FIG. 14 is a diagram for illustrating the example shown in FIG. 13, and showing an example of the current flow when the trigger signal is applied to the driving IC 522 of the switching element Q1. Here, although the switching element Q1 is described as the representing example, the other switching elements Q2-Q6 may be described similarly.

In the example shown in FIG. 13, the trigger signal includes a pulse significantly longer than the period of the carrier frequency. The pulse may be one pulse (that is, pulses such as shown in FIG. 11 or the like are not required). For example, the trigger signal may be a pulse whose width is longer than one period of the carrier frequency and shorter than two periods of the carrier frequency.

As shown in FIG. 13, a gate signal having a minimum duty may be provided to the driving IC 522 of the different phase in the opposed arm with respect to the driving IC 522 to which the trigger signal is sent. Thus, a large current caused by a long pulse of the trigger signal can be prevented. For example, in FIG. 14, a gate signal having a minimum duty is provided to the driving IC 522 of the switching element Q4 in the opposed arm. Additionally, the switching element of the in-phase opposed arm may be switched off during the transmission of the trigger signal.

According to the example shown in FIG. 13, the trigger signal can be easily recognized by the driving IC unit 520 and a highly precise internal clock in the driving IC unit 520 is not required in comparison with a case shown in FIG. 11 and the like. That is, the trigger signal can be distinguished from the gate signal without a highly precise internal clock.

Figure 15:
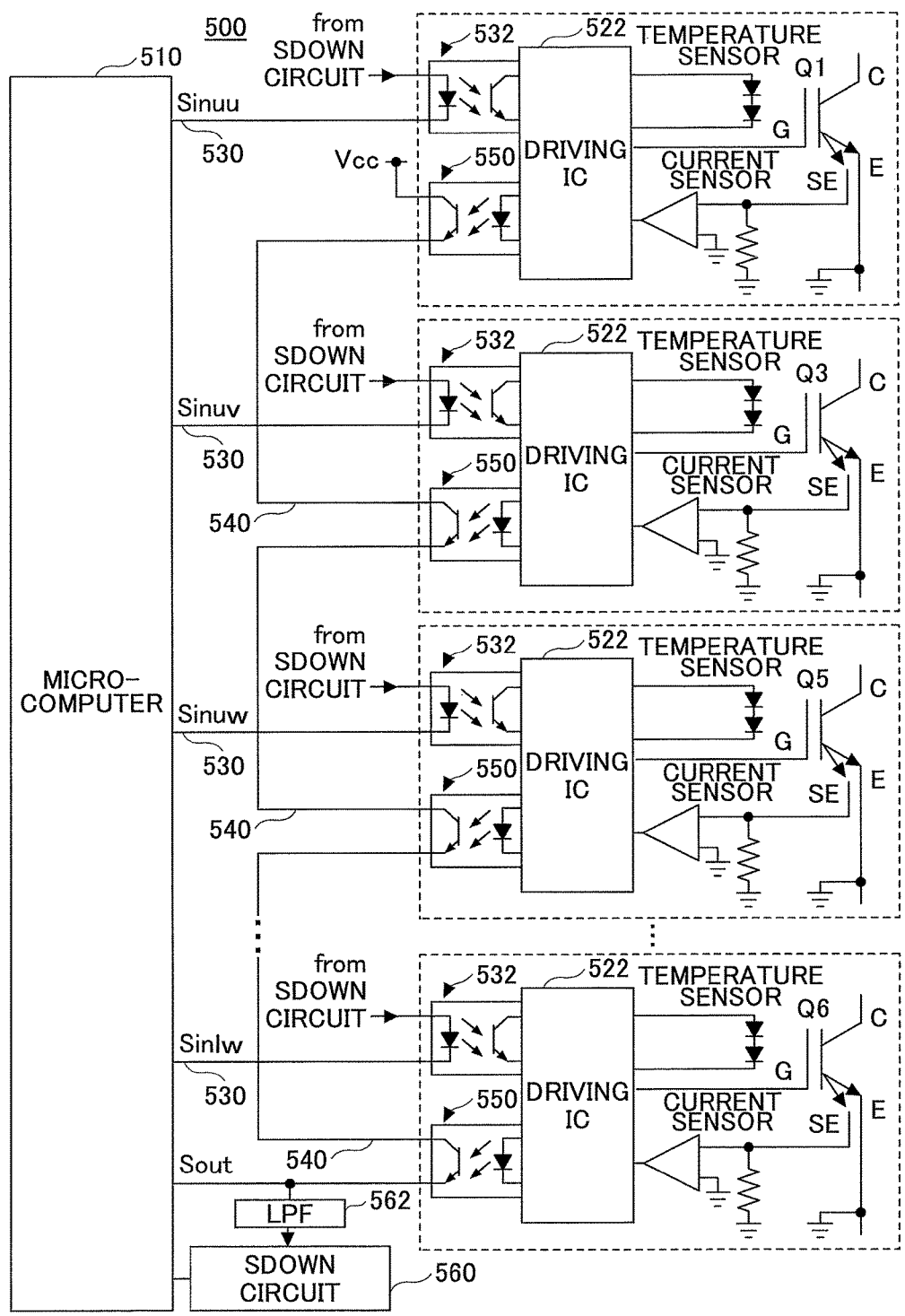
FIG. 15 is a diagram for illustrating another example configuration of the control unit 500 of the inverter 30 included in the semiconductor element drive device 50.
Figure 16:
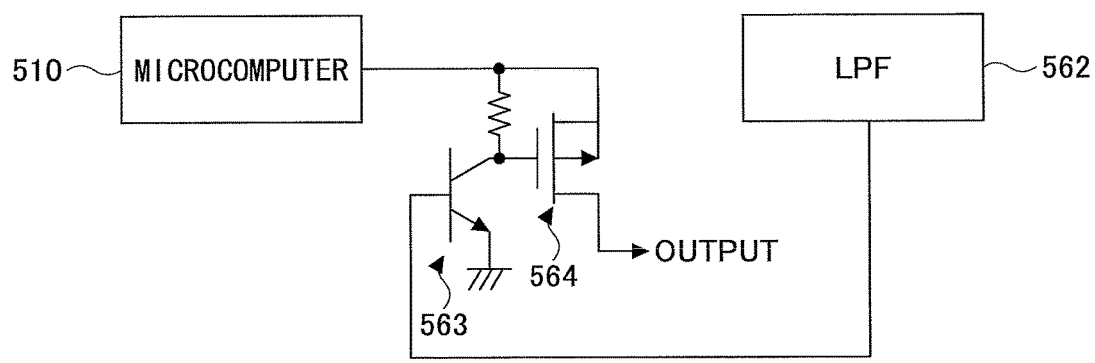
FIG. 16 is a diagram for illustrating an example of a SDOWN circuit 560.

FIG. 15 is a diagram for illustrating another example configuration of the control unit 500 of the inverter 30 included in the semiconductor element drive device 50. FIG. 16 is a diagram for illustrating an example of SDOWN circuit 560. Additionally, in FIG. 15, although the control unit 500 is described in a different manner from FIG. 2 (for example, temperature sensors, etc. are shown), there are not any substantial differences except the matters described in the following.

In the example shown in FIG. 15, a shutdown circuit (hereinafter referred to as "SDOWN circuit") 560 is connected with the communication line 540 for feedback signal, which is different from the example shown in FIG. 2. In other words, in the example shown in FIG. 15, a communication line for the SDOWN circuit 560 is used as the communication line 540 for feedback signal (i.e. used for both purposes).

The SDOWN circuit 560 has a function for preventing a concurrent breakdown of a neighboring arm by a surge that occurs when being short-circuited. That is, the SDOWN circuit 560 stops operating (switches off) the switching elements in the neighboring arm in response to a shutdown signal (quickly, not through the microcomputer 510) sent from the driving IC unit 520 when short-circuiting The SDOWN circuit 560 may be connected with the communication line 540 for feedback signal through a low-pass filter 562. The low-pass filter 562 is disposed so that the SDOWN circuit 560 does not unintendedly perform a shutdown operation in response to the feedback signal transmitted on the communication line 540 for feedback signal. That is, the low-pass filter 562 filters the feedback signal transmitted on the communication line 540 for feedback signal so as not to send the feedback signal to the SDOWN circuit. Additionally, since the SDOWN circuit 560 receives the shutdown signal through the low-pass filter 562 when the shutdown signal is generated, the SDOWN circuit 560 surely preforms the shutdown operation, although the responsiveness thereof becomes slightly inferior.

In the example shown in FIG. 16, the shutdown signal (Lo level) sent from the driving IC unit 520 is applied to a base of a transistor 563 included in the SDOWN circuit 560 through the low-pass filter 562. Thus, the transistor 563 is switched off and a transistor 564 is switched off which causes the output of the SDOWN circuit 560 to be Lo level. As shown in FIG. 15, the output of the SDOWN circuit 560 is connected with the communication line 530 for gate signal. Therefore, when the output of the SDOWN circuit 560 becomes Lo level, respective inputs of the driving ICs 522 become Lo level (the photodiode 532 is switched off), thereby switching off all the switching elements Q1-Q6 (that is, performing shutdown operation). Additionally, in the example shown in FIG. 16, normally (in operation), a Hi level signal is provided from the microcomputer 510 to the SDOWN circuit 560. Also, in a normal state, since a high level signal is provided, through the low-pass filter 562, to a base of the transistor 563 included in the SDOWN circuit 560, the transistor 563 is switched on and the transistor 564 is switched on which causes the output of the SDOWN circuit 560 to be Hi level. Thus, the communication line 530 for gate signal becomes available (signal level is switched between Hi level and Lo level according to the gate signal). Meanwhile, when the shutdown signal (Lo level) from the microcomputer 510 is input, the transistor 564 is switched off which causes the output of the SDOWN circuit 560 to be Lo level. Thus, respective inputs of the driving ICs 522 become Lo, thereby switching off all the switching elements Q1-Q6 (that is, performing a shutdown operation).

According to the example shown in FIG. 15, the feedback signal can be sent to the microcomputer 510 without increasing the number of communication lines since the communication line for the SDOWN circuit 560 is also used as the communication line 540 for feedback signal. That is, the feedback signal can be sent to the microcomputer 510 with a simple configuration in which the number of the communication lines are reduced (the area of substrate is reduced as well) in comparison with a configuration in which the communication line for SDOWN circuit 560 is separately disposed in addition to the communication line 540 for feedback signal. However, a configuration in which the communication line for SDOWN circuit 560 is set differently from the communication line 540 for feedback signal can be adopted.

In the following, a preferable operation in the example shown in FIG. 15 will be described, where the preferable operation may be performed in the example shown in FIG. 15 when an abnormality is detected.

The respective driving ICs 522 of the driving IC unit 520 send the feedback signal, as described above, to the microcomputer 510 without operating the SDOWN circuit 560 in a case where an abnormal overheating or an abnormal overcurrent is detected.

Meanwhile, when detecting short-circuiting, the respective driving ICs 522 of the driving IC unit 520 operates the SDOWN circuit 560 in order to prevent a concurrent breakdown. Specifically, the driving IC 522 detecting short-circuiting keeps the signal level on the communication line 540 for feedback signal to be Lo until a time greater than or equal to a predetermined time (for example, Tsdwn described below) passes (that is, the shutdown signal is generated). At this time, preferably, the driving ICs 522 sends the feedback signal to the microcomputer 510 when a time $\Delta T_s$, defined by a formula shown below, passes from the occurrence of short-circuiting in an arm.

$$\Delta T_s = 2 \times Tsdwn + (Tsdwn + Tcom) \times (N-1) \quad \text{formula (1)}$$

Wherein, the "Tsdwn" expresses the time it takes to perform shutting down of all the switching elements in the neighboring arm. The "Tcom" expresses the time it takes to send a feedback signal (abnormality information) of one arm. And the "N" expresses a sending sequence. The "Tsdwn" and the "Tcom" can be derived based on a result of a test conducted in advance or the like. The sending sequence "N" may be defined arbitrarily in advance.

In formula (1), a member (2×Tsdwn) is included which takes into account that a concurrent breakdown may occur until the time "Tsdwn" passes from the initial detection of short-circuiting, and the shutdown operation may continue up to the time (2×Tsdwn), passes at most, in a case where a concurrent breakdown occurs.

Also, in the formula (1), "Tsdwn×(N−1)" is calculated taking into account that a concurrent breakdown may occur until the time "Tsdwn" passes from the detection of short-circuiting, and a timing at which the short-circuiting is detected may be shifted up to the time "Tsdwn" at most between the arms. That is, the shift is eliminated by calculating "Tsdwn×(N−1)". Then, at worst, the timing to send the signal may be almost the same in the respective arms. Therefore, by calculating "Tcom×(N−1)", the signal is sent when a time defined for itself is passed from the timing to send the signal which is almost the same as that in another arm, thereby preventing an outputting of feedback signals from the driving ICs 522 onto the communication line 540 at almost the same time.

Figure 17:
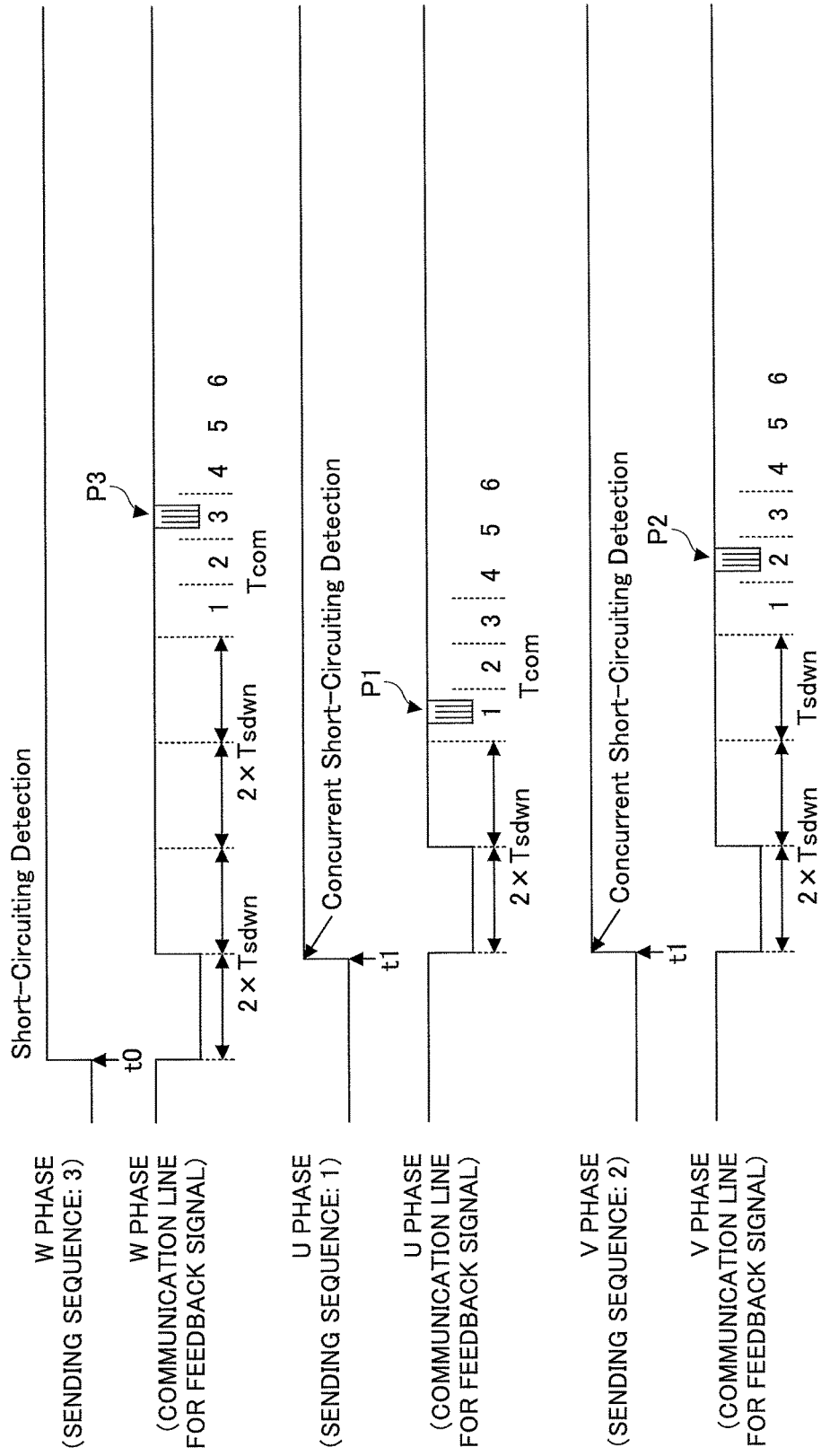
FIG. 17 is a timing diagram for illustrating an example of a timing to send a signal when detecting short-circuiting.

Further, the purpose of the formula (1) is described with reference to FIG. 17. FIG. 17 is a timing diagram for illustrating an example of a timing to send the signal when detecting short-circuiting. Here, three arms of the three phases in the upper arm are described among the six arms, and the sending sequence is that the U phase is first, the V phase is second and the W phase is third, for convenience of explanation. In FIG. 17, from the top, a short-circuiting detection state in the W phase (upper arm), an output signal from the driving IC 522 of the W phase (upper arm) onto the communication line 540 for feedback signal, a short-circuiting detection state in the U phase (upper arm), an output signal from the driving IC 522 of the U phase (upper arm) onto the communication line 540 for feedback signal, a short-circuiting detection state in the V phase (upper arm), and an output signal from the driving IC 522 of the V phase (upper arm) onto the communication line 540 for feedback signal are shown.

In the example, shown in FIG. 17, at timing t0, short-circuiting is detected in the phase W (upper arm). Then, the output signal from the driving IC 522 of the W phase (upper arm) is changed into Lo level, and is kept with Lo level until the time "Tsdwn" passes. Short-circuiting is detected in the U phase (upper arm) and the V phase (upper arm) at timing t1 just before the time "Tsdwn" passes from the detection of short-circuiting in the W phase. Additionally, short circuiting in the U phase and the V phase is caused by the concurrent breakdown. Then, output signals from the driving ICs 522 of the U phase (upper arm) and the V phase (upper arm) are changed into Lo level and are kept at Lo level until the time "Tsdwn" passes. At this time, according to the formula (1), timings to send the signal in the respective arms are defined as follows.

In U phase (upper arm);

$$\Delta T_s = 2 \times Tsdwn$$

In V phase (upper arm);

$$\Delta T_s = 2 \times Tsdwn + Tsdwn + Tcom$$

In W phase (upper arm);

$$\Delta T_s = 2 \times Tsdwn + 2 \times (Tsdwn + Tcom)$$

In this case, at first, as shown by reference character P1 in FIG. 17, the driving IC 522 of the U phase outputs the feedback signal onto the communication line 540 for feedback signal when $\Delta T_s (= 2 \times Tsdwn)$ passes from timing t1 at which short-circuiting is detected. Then, as shown by reference character P2 in FIG. 17, the driving IC 522 of the V phase outputs the feedback signal onto the communication line 540 for feedback signal when $\Delta T_s (= 2 \times Tsdwn + Tsdwn + Tcom)$ passes from timing t1 at which short-circuiting is detected. Next, as shown by reference character P3 in FIG. 17, the driving IC 522 of the W phase outputs the feedback signal onto the communication line 540 for feedback signal when $\Delta T_s (= 2 \times Tsdwn + 2 \times Tsdwn + 2 \times Tcom))$ passes from timing t0 at which short-circuiting is detected.

By the way, the driving IC 522 cannot solely (without communicating with another driving IC 522) determine whether the detection of short-circuiting by itself is the first one or not. For example, in the example shown in FIG. 17, although the detection of short-circuiting in the W phase (upper arm) is the first one, the driving IC 522 of the W phase (upper arm) cannot determine that the detection of short-circuiting by itself is the first one. Therefore, when short-circuiting caused by the concurrent break down occurs, the respective arms solely determine timings to send the feedback signal, which is likely to cause interference. As shown in FIG. 17, in a case where the respective arms determine timings to send the feedback signal according to the formula (1), the feedback signals can surely be sent from the respective driving ICs 522 with varied time differences to the microcomputer 510 even when short-circuiting caused by the concurrent break down occurs.

Figure 18:
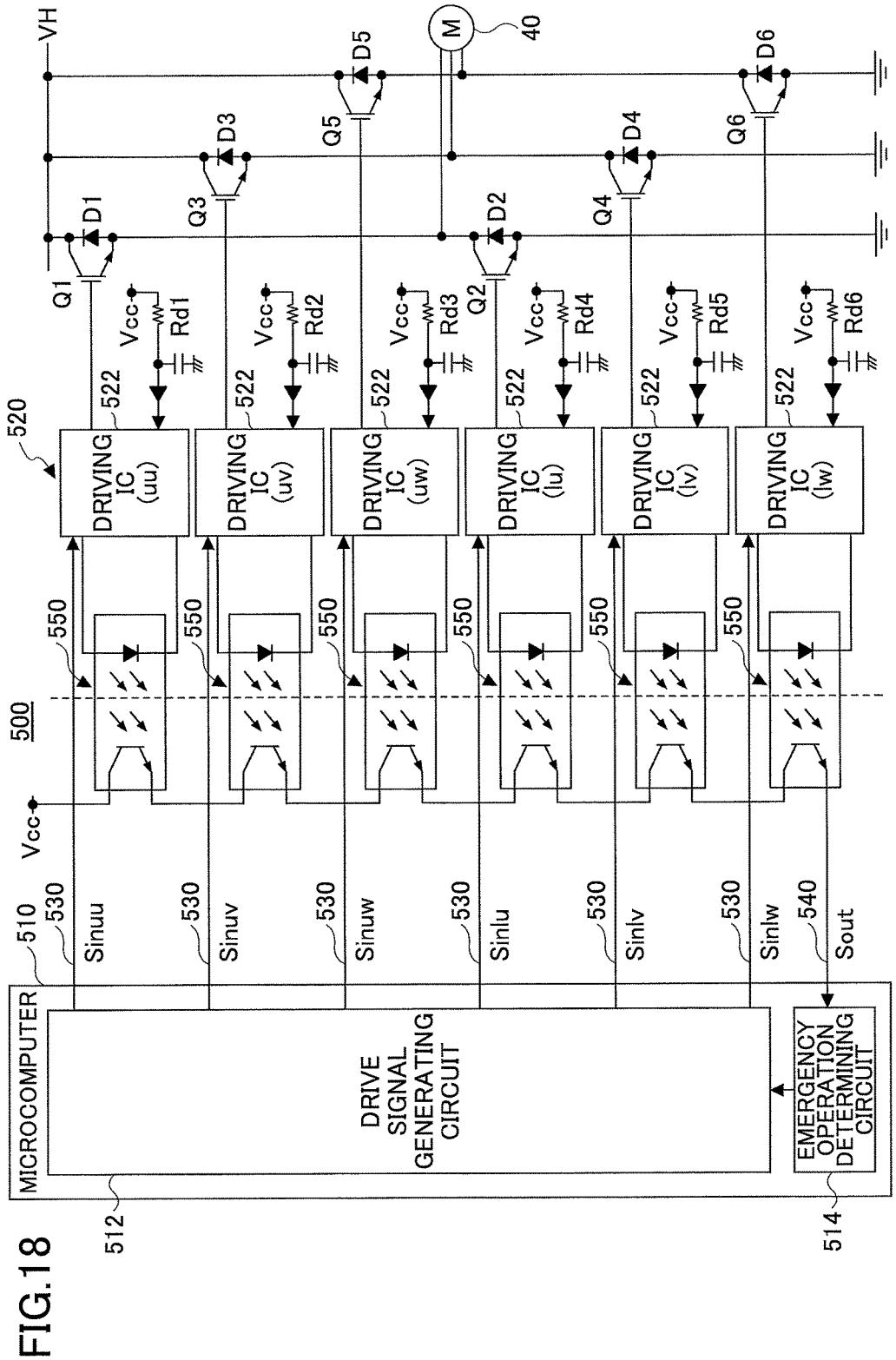
FIG. 18 is a diagram for illustrating another example configuration of the control unit 500 of the inverter 30 included in the semiconductor element drive device 50.

FIG. 18 is a diagram for illustrating another example configuration of the control unit 500 of the inverter 30 included in the semiconductor element drive device 50.

In the example shown in FIG. 18, the respective driving ICs 522 are connected to the power supply voltage Vcc through delay time control resistors (Rd1, Rd2, etc.), which is different from the example shown in FIG. 2. The delay time control resistors Rd1, Rd2, Rd3, Rd4, Rd5 and Rd6 have different respective resistance values. Thus, the respective driving ICs 522 are activated at different timings when powered. Therefore, the feedback signals can be sent from the driving ICs 522 at different timings in response to powering up.

Figure 19:
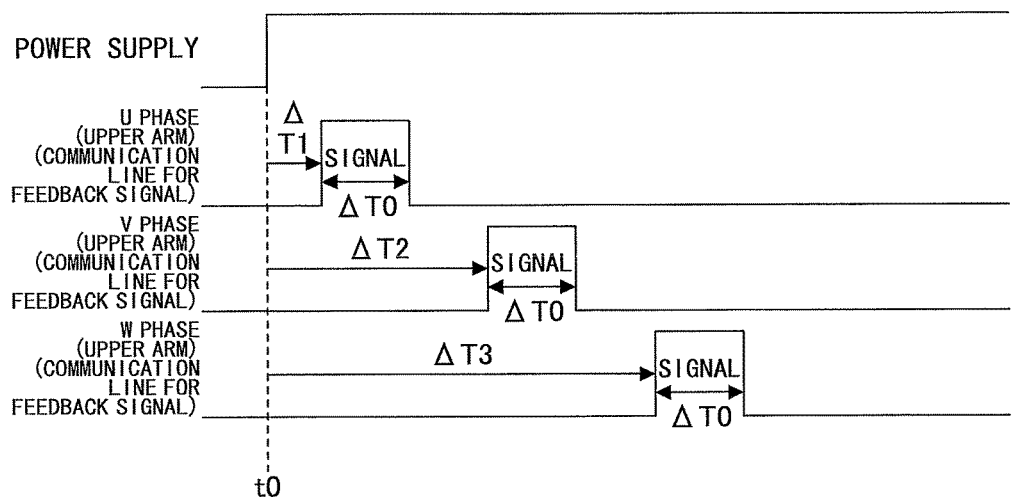
FIG. 19 is a timing diagram for illustrating an example of timings to send the feedback signals from the driving ICs 522.

FIG. 19 is a timing diagram for illustrating an operation performed in the example shown in FIG. 18, where an example of timings to send feedback signals from the driving ICs 522 in response to powering up is shown. Here, three arms of the three phases in the upper arm are described among the six arms, and the sending sequence is that the U phase is first, the V phase is second and the W phase is third for convenience of explanation. In FIG. 19, from the top, the on/off state of the power supply, the output signal from the driving IC 522 of the U phase (upper arm) onto the communication line 540 for feedback signal, the output signal from the driving IC 522 of the V phase (upper arm) onto the communication line 540 for feedback signal, and the output signal from the driving IC 522 of the W phase (upper arm) onto the communication line 540 for feedback signal are shown.

In the example shown in FIG. 19, at timing t0, the power supply is turned on. The driving IC 522 of the U phase (upper arm) outputs the feedback signal onto the communication line 540 when a time $\Delta T1$ passes from turning on the power supply. The time $\Delta T1$ is a delay time corresponding to a delay time control resistor Rd1. Similarly, the driving IC 522 of the V phase (upper arm) outputs the feedback signal onto the communication line 540 when a time $\Delta T2$ passes from turning on the power supply. The time $\Delta T2$ is a delay time corresponding to a delay time control resistor Rd2. Similarly, the driving IC 522 of the W phase (upper arm) outputs the feedback signal onto the communication line 540 when a time $\Delta T3$ passes from turning on the power supply. The time $\Delta T3$ is a delay time corresponding to a delay time control resistor Rd3. Here, $\Delta T2$ is greater than $(\Delta T0+\Delta T1)$ ($\Delta T0$: time taken to output feedback signal), and similarly, $\Delta T3$ is greater than $(\Delta T0+\Delta T2)$. Additionally, for example, the driving IC 522 of the U phase (lower arm), the driving IC 522 of the V phase (lower arm), and the driving IC 522 of the W phase (lower arm) respectively output the feedback signals onto the communication line 540 for feedback signal when times $\Delta T4$, $\Delta T5$, and $\Delta T6$ respectively pass from turning on the power supply. Similarly, $\Delta T4$ is greater than $(\Delta T0+\Delta T3)$, $\Delta T5$ is greater than $(\Delta T0+\Delta T4)$ and $\Delta T6$ is greater than $(\Delta T0+\Delta T5)$. Thus, the feedback signals can surely be sent from the respective driving ICs 522 with time differences to the microcomputer 510 when powering up.

Figure 20:
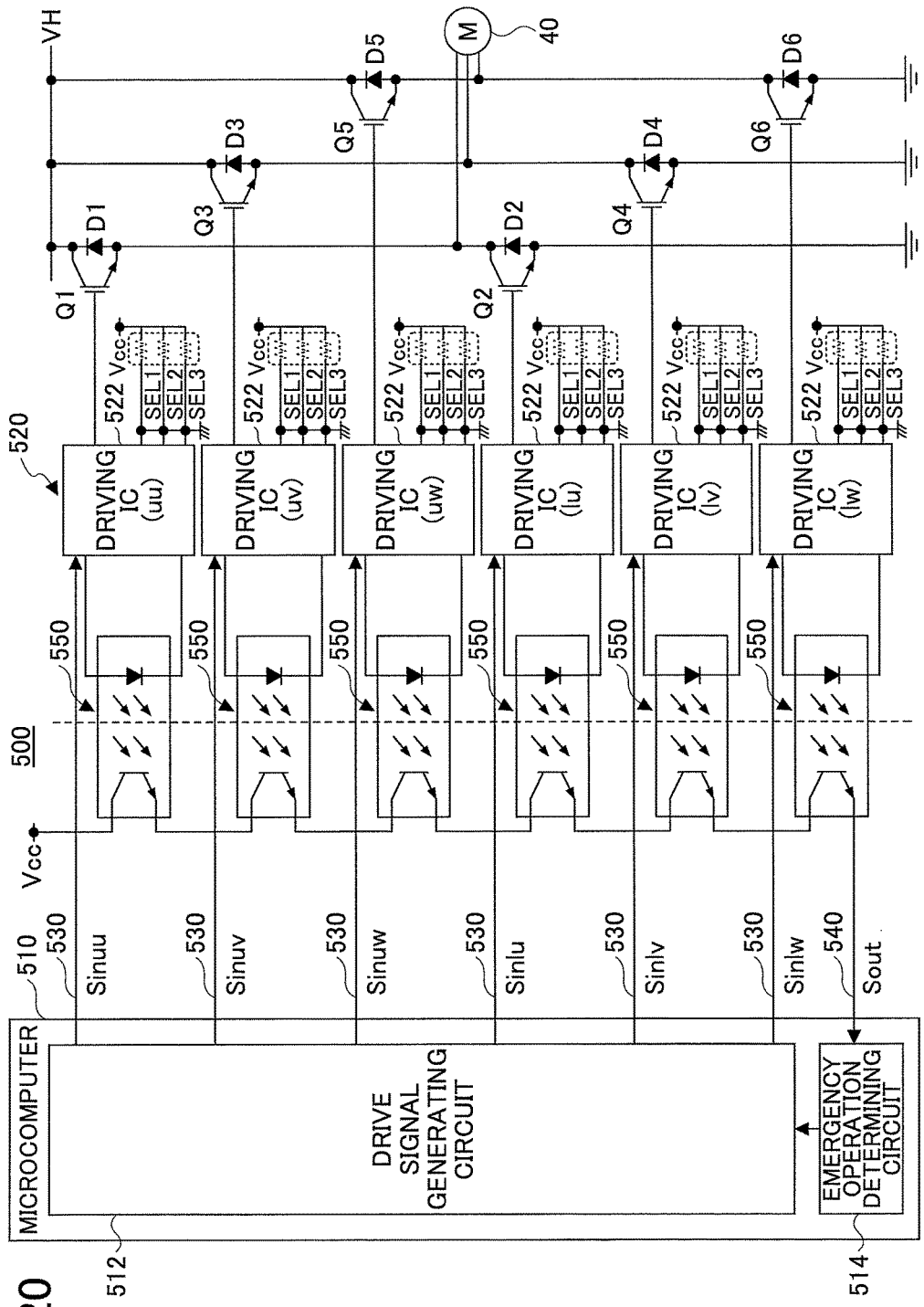
FIG. 20 is a diagram for illustrating another example of the control unit 500 of the inverter 30 included in the semiconductor element drive device 50.

FIG. 20 is a diagram for illustrating another example of the control unit 500 of the inverter 30 included in the semiconductor element drive device 50.

In the example shown in FIG. 20, delay selection resistors SEL are disposed instead of the delay time control resistors, which is different from the example shown in FIG. 18. Additionally, in the example shown in FIG. 20, the delay selection resistors SEL are disposed in the respective arms, and the delay selection resistors SEL in the respective arms may have identical configurations including three resistors (for example, having respectively different resistance values). However, the resistors included in the delay selection resistors SEL are selected so that the resistance values of the respective arms become different from each other. Thus, the respective driving ICs 522 are activated at different timings when powered. Therefore, feedback signals can be sent from the driving ICs 522 at different timings in response to powering up.

Additionally, in the description above, although the configuration of the control unit 500 of the inverter 30 included in the semiconductor element drive device 50 is described, the similar configuration can be applied to a control unit of the DC/DC converter 20 included in the semiconductor element drive device 50. In the following, the control unit of the DC/DC converter 20 included in the semiconductor element drive device 50 will be described.

Figure 21:
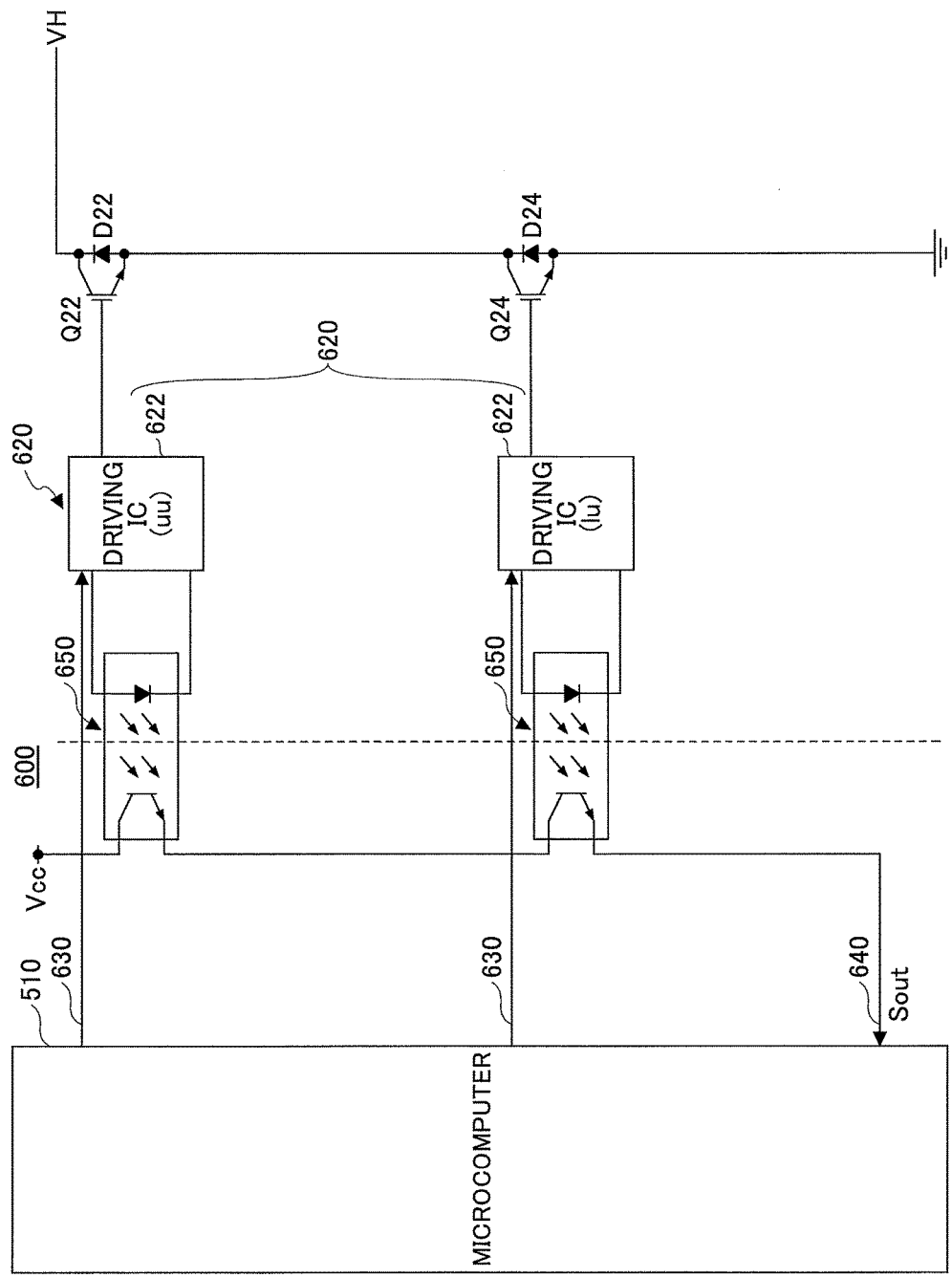
FIG. 21 is a diagram for illustrating an example of a control unit 600 of a DC/DC converter 20 included in the semiconductor element drive device 50.

FIG. 21 is a diagram for illustrating an example of the control unit 600 of the DC/DC converter 20 included in the semiconductor element drive device 50.

The control unit 600 of the DC/DC converter 20 includes the microcomputer 510 and a driving IC unit 620. The driving IC unit 620 includes two driving ICs 622 corresponding to switching elements Q22 and Q24. Additionally, the two driving ICs 622 may be achieved by one driving IC. In this case, the one driving IC includes respective circuit parts corresponding to the two driving ICs 622.

A communication line 630 for gate signal and a communication line 640 for feedback signal are disposed between the microcomputer 510 and the driving IC unit 620. Two communication lines 630 for gate signals are disposed corresponding to the switching elements Q22 and Q24. That is, the communication lines 630 for gate signals are respectively disposed corresponding to the two driving ICs 622. Meanwhile, as shown in FIG. 21, the communication line 640 for feedback signal is common to the two driving ICs 622. That is, as shown in FIG. 21, only one communication line 640 for feedback signal is disposed. One end of the communication line 640 for feedback signal is connected to a power supply voltage Vcc, while the other end thereof is connected to the microcomputer 510. The communication line 640 for feedback signal includes two photocouplers 650 corresponding to the respective two driving ICs 622. As shown in FIG. 21, the two photocouplers 650 may be connected in series between the power supply voltage Vcc and the microcomputer 510, or may be connected in parallel (see FIG. 4). The driving ICs 622 respectively sends feedback signals (IC output signal Sout) to the microcomputer 510 by switching on/off the corresponding photocouplers 650 to vary a voltage level of the communication line 640 for feedback signal between "Hi" and "Lo". The feedback signal may be similar to the aforementioned feedback signal.

Additionally, the aforementioned configurations in the control unit 500 of the inverter 30 may be applied to the control unit 600 of the DC/DC converter 20. For example, in the control unit 600 of the DC/DC converter 20, the aforementioned trigger signal (see FIG. 11 and FIG. 12) may be used and the communication line 640 for feedback signal may be also used as the SDOWN circuit (see FIG. 15).

Also, the control unit 600 of the DC/DC converter 20 may be configured integrally with the control unit 500 of the inverter 30. That is, the communication line 640 for feedback signal may also be used as the communication line 540 for feedback signal. However, the communication line 640 for feedback signal may be disposed separately from the communication line 540 for feedback signal.

Figure 22:
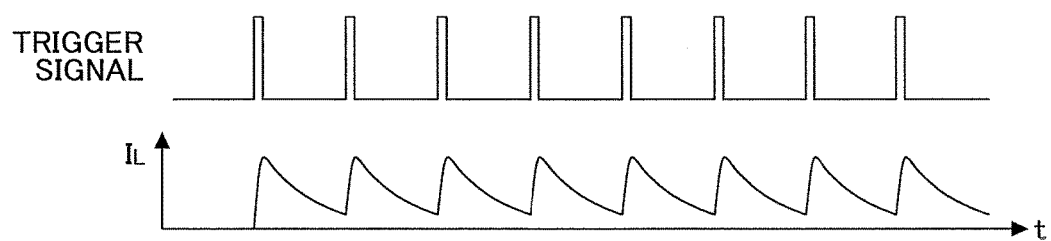
FIG. 22 is a diagram for illustrating an example relationship between the trigger signal and the current flowing in reactor L1 (reactor current IL).

FIG. 22 is a diagram for illustrating an example relationship between the trigger signal and current flowing in the reactor L1 (reactor current $I_L$).

For example, in the control unit 600 of the DC/DC converter 20, the trigger signal described with reference to FIG. 12 may be used. In this case, as shown in FIG. 22, a ripple current flows as the reactor current $I_L$ in response to pulses in the trigger signal. Additionally, the voltage VH may be increased by a current flow of the ripple current, however, the voltage VH can be maintained within a rating since the pulse width of the trigger signal is minute (having small duty).

Since the switching elements Q22 and Q24 of the DC/DC converter 20 are heated by the ripple current, a degeneration (or an abnormality; hereinafter the same shall apply) of the heat radiation structure may be estimated by using the heat. For example, the degeneration of the heat radiation structure may be detected in a case where the temperature of the switching elements Q22 and Q24 exceed a threshold value when applying the trigger signal. At this time, the temperature of the switching elements Q22 and Q24 with respect to cooling water, tendency of fluctuation of temperature of the switching elements Q22 and Q24 in a relatively long term (for example, one month) and the like may be taken into account. Further, a relationship between a number of pulses in the trigger signal and the heating temperature (for example, in a normal state and in a degenerated state) may be derived through experiments and the like in advance and stored in the microcomputer 510. Additionally, the estimate of the degeneration may be performed at an arbitrary timing. For example, an estimation of the degeneration may be performed when turning on the ignition switch. Also, the aforementioned method for estimating the degeneration of the heat radiation structure may be applied to the estimation of the degeneration of the heat radiation structure of the inverter 30.

Herein above, although the invention has been described with respect to a specific embodiment, the appended claims are not to be thus limited. It should be understood that the various changes, substitutions, and alterations could be made hereto without departing from the spirit and scope of the claims. Further, all or part of the components of the embodiments described above can be combined.

For example, although the feedback signals are sent from the driving IC unit 520 for driving the switching elements Q1-Q6 to the microcomputer 510 in the embodiments described above, similar feedback signals may be sent from other circuit units respectively corresponding to the switching elements Q1-Q6 to the microcomputer 510. The other circuit units are different from the driving IC unit 520, while they are disposed respectively corresponding to the switching elements Q1-Q6. The other circuit units may send the feedback signals to the microcomputer 510 through the driving IC unit 520 or may send the feedback signals to the microcomputer 510 not through the driving IC unit 520. In the latter case, the other circuit units may be connected with the microcomputer 510 through the communication line 540 for feedback signal instead of the driving IC unit 520.

Also, in the embodiments described above, although the microcomputer 510 includes the emergency operation determining circuit 514, the emergency operation determining circuit 514 may be omitted in a case where an emergency operation is not performed (for example, only an alarm or the like is output when detecting an abnormality).

Also, in the embodiments described above, although the microcomputer 510 capable of communicating with the driving IC unit 520 is insulated from the driving IC unit 520 in a higher voltage side by using the photocouplers 550, a similar configuration may be achieved by using an insulating element or the like other than the photocouplers 550. For example, a similar configuration may be achieved by a magnetic coupling element such as a transformer, a capacitive coupling element, a high withstanding voltage element or the like.

Further, in the embodiments described above, although a single communication line 540 for feedback signal which is common to the driving ICs 522 is used, the communication line 540 for feedback signal may be disposed for every driving IC 522 or may be disposed so as to be common to every certain number (for example, two) of the driving ICs 522 among the driving ICs 522. According to the aforementioned configuration, interference caused by sending the feedback signals simultaneously from the driving ICs 522 can be prevented while the cost may be increased.

1 motor drive system
10 battery
20 DC/DC converter
30 inverter
40 traveling motor
50 semiconductor element drive device
500 control unit
510 microcomputer
512 drive signal generating circuit
514 emergency operation determining circuit
520 driving IC unit
522 driving IC
530 communication line for gate signal
540 communication line for feedback signal
550 photocoupler
562 low-pass filter

The invention claimed is:

1. An electronic device comprising:
a plurality of switching elements connected to a power supply;
a plurality of specific information storage units provided for the corresponding switching elements and configured to store specific information of respective corresponding switching elements, wherein the specific information storage units include a plurality of driving circuits provided for the corresponding switching element;
a processing unit configured to control the switching elements through the driving circuits; and
a communication line disposed between the specific information storage units and the processing unit, through which the specific information of the respective switching elements is sent from the specific information storage units to the processing unit, the communication line being single and common to the specific information storage units; and
a plurality of drive signal communication lines disposed between the respective driving circuits and the processing unit through which drive signals for driving the respective switching elements are sent from the processing unit to the driving circuits, wherein
the driving circuits send the specific information when receiving a predetermined signal from the processing unit through the drive signal communication lines, and
wherein the predetermined signal is generated at a higher frequency than a carrier signal for switching on/off the switching elements.

2. The electronic device as claimed in claim 1, wherein the predetermined signal is a pulse signal whose pulse width is longer than a period corresponding to a frequency of a carrier signal for switching on/off the switching elements.

3. An electronic device comprising:
a plurality of switching elements connected to a power supply;
a plurality of specific information storage units provided for the corresponding switching elements and configured to store specific information of respective corresponding switching elements, wherein the specific information storage units include a plurality of driving circuits provided for the corresponding switching elements;
a processing unit configured to control the switching elements through the driving circuits; and
a communication line disposed between the specific information storage units and the processing unit, through which the specific information of the respective switching elements is sent from the specific information storage units to the processing unit, wherein the driving circuits are connected to the power supply through delay resistors whose resistance values are different from each other.

4. An electronic device comprising:
a plurality of switching elements connected to a power supply;
a plurality of specific information storage units provided for the corresponding switching elements and configured to store specific information of respective corresponding switching elements;
a processing unit configured to control the switching elements;
a communication line disposed between the specific information storage units and the processing unit, through which the specific information of the respective switching elements is sent from the specific information storage units to the processing unit, the communication line being single and common to the specific information storage units; and
a shutdown circuit, connected to the single communication line through a low-pass filter, configured to switch off the switching elements upon an abnormality thereof being detected.

5. The electronic device as claimed in claim 4, wherein the respective driving circuits cause the shutdown circuit to perform a shutdown operation when detecting short-circuiting abnormality, and send the specific information onto the single communication line at different timings according to a certain sending sequence after performing the shutdown operation.

* * * * *